United States Patent
Kubo

(10) Patent No.: US 11,264,451 B2
(45) Date of Patent: Mar. 1, 2022

(54) SEMICONDUCTOR DEVICE EXHIBITING SOFT RECOVERY CHARACTERISTICS

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/823,938

(22) Filed: Mar. 19, 2020

(65) Prior Publication Data

US 2020/0312955 A1 Oct. 1, 2020

(30) Foreign Application Priority Data

Mar. 27, 2019 (JP) .............................. JP2019-061329

(51) Int. Cl.
| | |
|---|---|
| H01L 29/06 | (2006.01) |
| H01L 29/78 | (2006.01) |
| H01L 29/66 | (2006.01) |
| H01L 29/417 | (2006.01) |

(52) U.S. Cl.
CPC ...... *H01L 29/0634* (2013.01); *H01L 29/0696* (2013.01); *H01L 29/41741* (2013.01); *H01L 29/66333* (2013.01); *H01L 29/7804* (2013.01)

(58) Field of Classification Search
CPC ............. H01L 29/0634; H01L 29/7804; H01L 29/66333; H01L 29/0696; H01L 29/41741; H01L 29/417; H01L 29/7395
USPC ....................................................... 257/139
See application file for complete search history.

(56) References Cited

U.S. PATENT DOCUMENTS

| | | | | |
|---|---|---|---|---|
| 9,136,381 | B1 * | 9/2015 | Kocon | ................ H01L 29/0878 |
| 2012/0313164 | A1 * | 12/2012 | Senoo | ............... H01L 29/66348 |
| | | | | 257/330 |
| 2017/0018636 | A1 * | 1/2017 | Naito | .................. H01L 29/0649 |
| 2017/0110535 | A1 * | 4/2017 | Yilmaz | ................ H01L 29/1095 |
| 2017/0162680 | A1 * | 6/2017 | Soeno | ................ H01L 29/0696 |
| 2017/0250269 | A1 * | 8/2017 | Sumitomo | ............. H01L 27/04 |
| 2017/0301779 | A1 * | 10/2017 | Naito | .................. H01L 29/0834 |
| 2019/0206988 | A1 * | 7/2019 | Padmanabhan | ..... H01L 21/2253 |
| 2020/0373382 | A1 * | 11/2020 | Osaga | ..................... H01L 29/08 |

FOREIGN PATENT DOCUMENTS

JP 2006261562 9/2006

* cited by examiner

*Primary Examiner* — Mohammad M Hoque
(74) *Attorney, Agent, or Firm* — Hamre, Schumann, Mueller & Larson, P.C.

(57) ABSTRACT

A semiconductor device includes a semiconductor layer having a first surface and a second surface, a first region of a first conductivity type formed on the first surface side of the semiconductor layer, a second region of a second conductivity type in contact with the first region, a third region of the first conductivity type that is in contact with the second region and exposed from the first surface side of the semiconductor layer, a gate electrode facing the second region through a gate insulating film, a first electrode that is physically separated from the gate electrode and faces the second region and the third region through an insulating film, a second electrode formed on the semiconductor layer and electrically connected to the first region, the second region, and the first electrode, and a third electrode electrically connected to the third region.

14 Claims, 20 Drawing Sheets

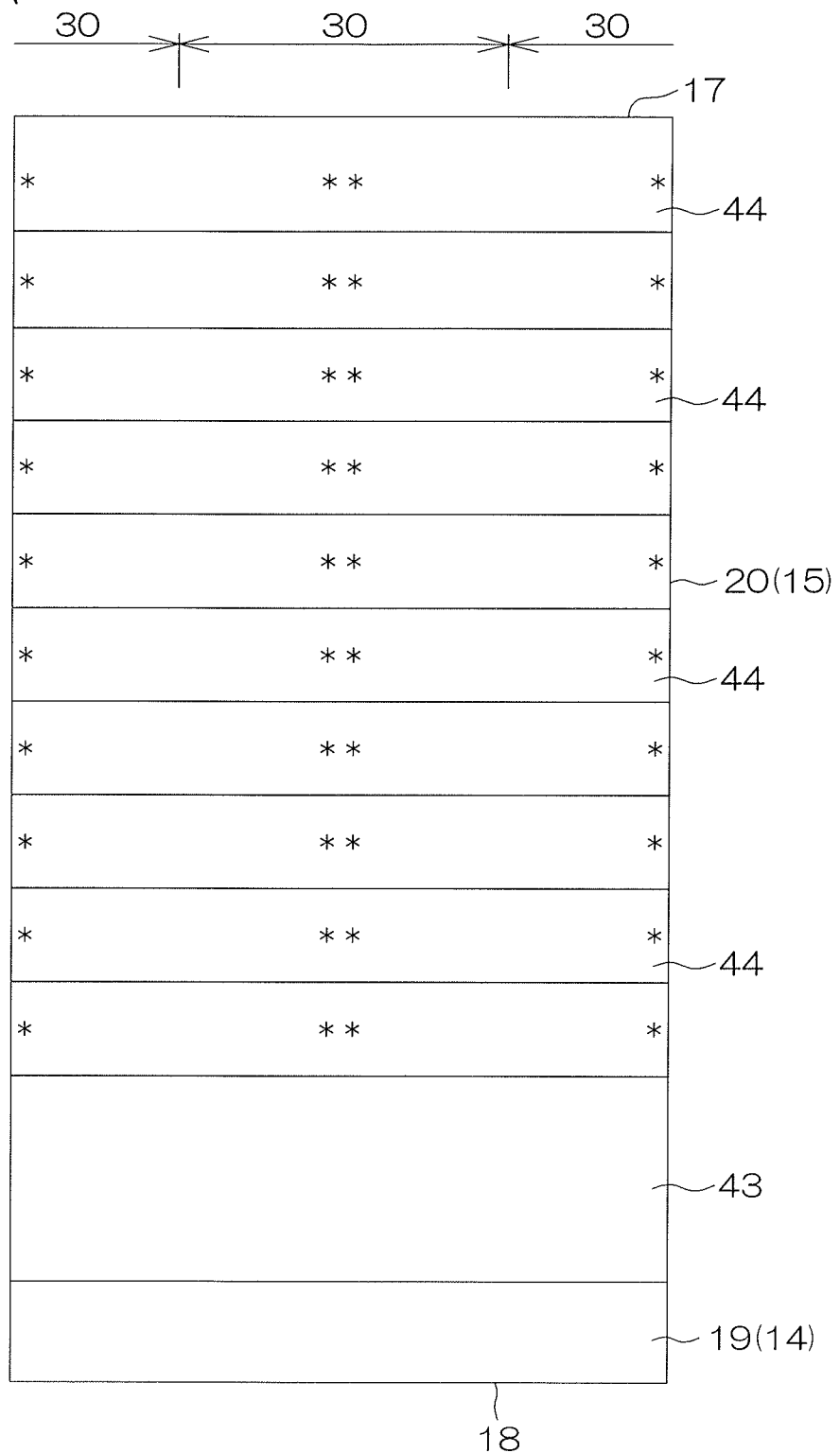

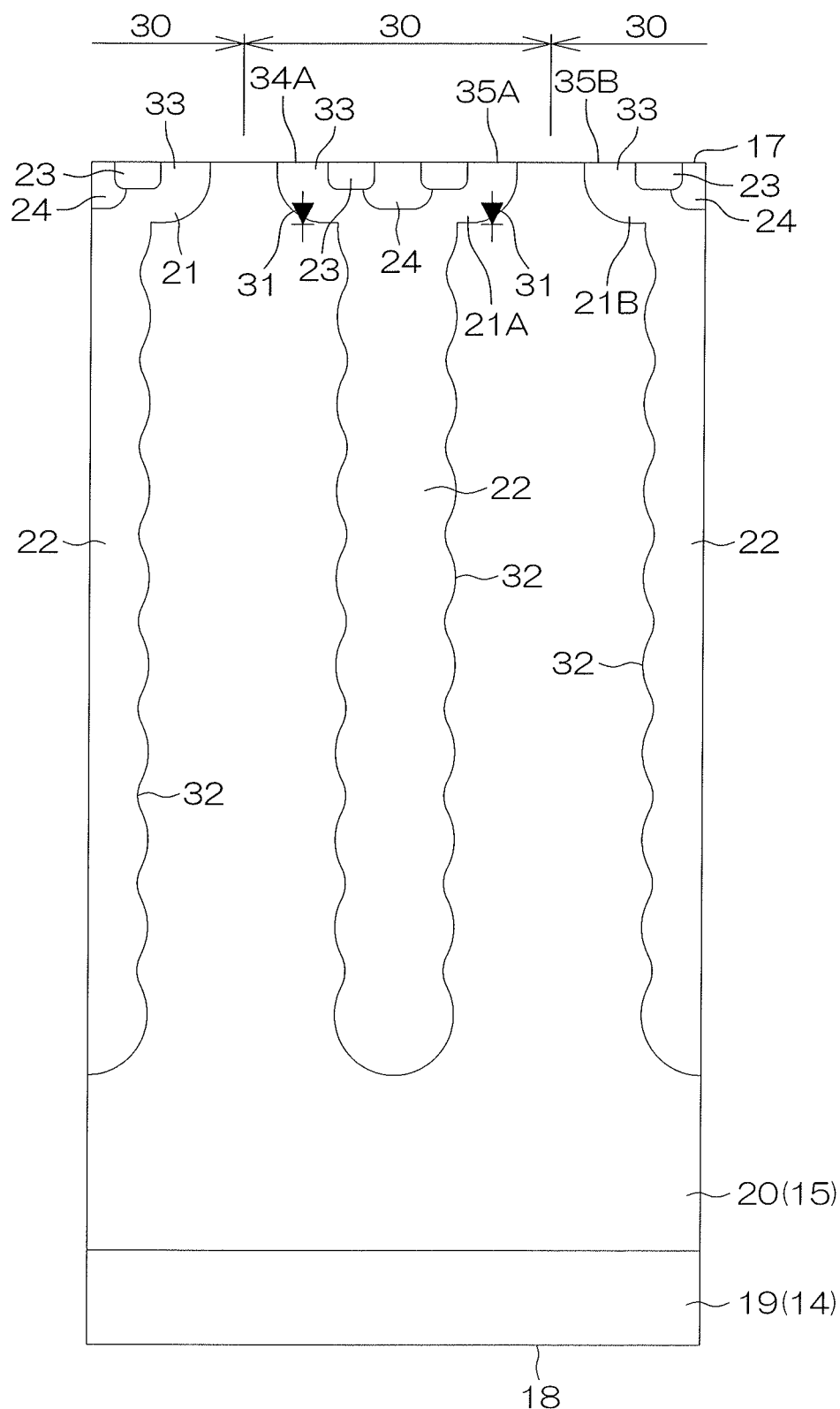

SEMICONDUCTOR DEVICE EXHIBITING SOFT RECOVERY CHARACTERISTICS

CROSS-REFERENCE TO RELATED APPLICATIONS

The present application corresponds to Japanese Patent Application No. 2019-061329 filed in the Japan Patent Office on Mar. 27, 2019, and the entire disclosure of this application is incorporated herein by reference.

TECHNICAL FIELD

The present invention relates to a semiconductor device.

BACKGROUND ART

Patent Document 1 (Japanese Patent Application Publication No. 2006-261562) discloses a MOSFET. The MOSFET has a super junction structure provided between a semiconductor substrate containing an $n^+$ type impurity and a base layer containing a p type impurity. The super junction structure is formed by alternately and repeatedly placing first semiconductor layers, each containing an n type impurity, and second semiconductor layers, each containing a p type impurity, in a direction intersecting with the direction in which the semiconductor substrate faces the base layer.

SUMMARY OF INVENTION

For example, when a MOSFET is applied to an inverter circuit that drives an inductive load such as an electric motor, etc., the source electrode is set at a higher potential than the drain electrode, the parasitic diode is thereby turned on, and a current flows through the parasitic diode in some cases. Thereafter, when the potential of the source electrode becomes lower than that of the drain electrode, the parasitic diode is reversely biased and turned off.

When this parasitic diode is turned off, a depletion layer extends from the pn junction portion of the parasitic diode, carriers (holes) in a p type body region move to the source electrode side, and carriers (electrons) in an $n^-$ type drift layer move to the drain electrode side. Accordingly, when the parasitic diode is turned off, the parasitic diode exhibits so-called hard recovery characteristics, that is, a reverse current flows in the parasitic diode and the reverse current abruptly returns to zero (the time rate of change in reverse current is large). Such hard recovery characteristics become a cause of noise (recovery noise).

Such problems can occur not only in a super junction MOSFET as disclosed in Patent Document 1 but also in any elements having parasitic diodes, for example, general MOSFETs and IGBTs not including any super junction structures.

It is an object of the present invention to provide a semiconductor device that can exhibit soft recovery characteristics.

A semiconductor device according to an aspect of the present invention includes a semiconductor layer having a first surface and a second surface, a first region of a first conductivity type formed on the first surface side of the semiconductor layer, a second region of a second conductivity type in contact with the first region, a third region of the first conductivity type that is in contact with the second region and exposed from the first surface side of the semiconductor layer, a gate electrode facing the second region through a gate insulating film, a first electrode that is physically separated from the gate electrode and faces the second region and the third region through an insulating film, a second electrode formed on the semiconductor layer and electrically connected to the first region, the second region, and the first electrode, and a third electrode electrically connected to the third region.

Effects of Invention

In the semiconductor device according to an aspect of the present invention, a parasitic diode is formed in a semiconductor layer by the pn junction between the second region and the third region. A case in which the second and third regions are respectively a p type region and an n type region is considered. In this case, because the second electrode is connected to the first electrode, the density of holes in an n type region (third region) in the first surface of the semiconductor layer locally decreases when the parasitic diode is turned off. This facilitates a depletion layer to extend in the first surface of the semiconductor layer and it is made possible to advance the timing at which the depletion layer extends. This allows the depletion layer to gradually extend from the first surface of the semiconductor layer. As a result, it is possible to make a reverse current flowing in the parasitic diode slowly return to zero when the parasitic diode is turned off, thereby making the reverse recovery characteristics of the parasitic diode approach soft recovery characteristics.

DESCRIPTION OF EMBODIMENTS

Preferred Embodiments of Present Invention

Figure 1:
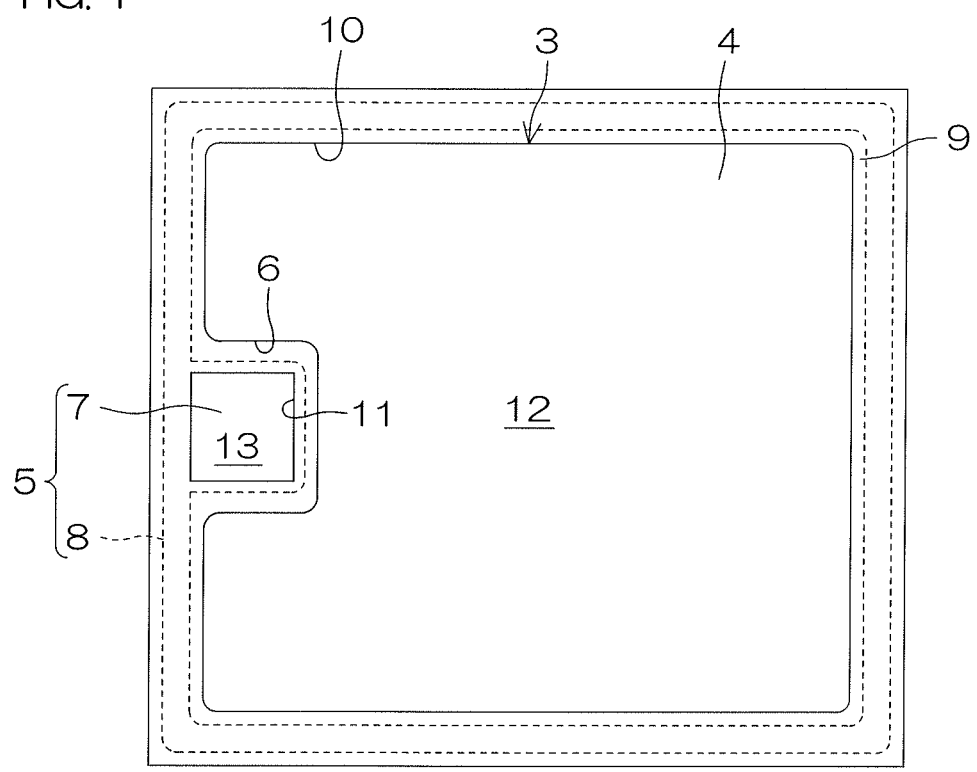
FIG. 1 is a schematic plan view of a semiconductor device according to a preferred embodiment of the present invention.

First, preferred embodiments of the present invention will be listed and described.

A semiconductor device according to an aspect of the present invention includes a semiconductor layer having a first surface and a second surface, a first region of a first conductivity type formed on the first surface side of the semiconductor layer, a second region of a second conductivity type in contact with the first region, a third region of the first conductivity type that is in contact with the second region and exposed from the first surface side of the semiconductor layer, a gate electrode facing the second region through a gate insulating film, a first electrode that is physically separated from the gate electrode and faces the second region and the third region through an insulating film, a second electrode formed on the semiconductor layer and electrically connected to the first region, the second region, and the first electrode, and a third electrode electrically connected to the third region.

According to this arrangement, a parasitic diode is formed in a semiconductor layer by the pn junction between the second region and the third region. A case in which the second and third regions are respectively a p type region and an n type region is considered. In this case, because the second electrode is connected to the first electrode, the density of holes in an n type region (third region) in the first surface of the semiconductor layer locally decreases when the parasitic diode is turned off. This facilitates a depletion layer to extend in the first surface of the semiconductor layer and it is made possible to advance the timing at which the depletion layer extends. This allows the depletion layer to gradually extend from the first surface of the semiconductor layer. As a result, it is possible to make a reverse current flowing in the parasitic diode slowly return to zero when the parasitic diode is turned off, thereby making the reverse recovery characteristics of the parasitic diode approach soft recovery characteristics.

The semiconductor device according to a preferred embodiment of the present invention may further include a second insulating film that is formed on the semiconductor layer, covers the gate electrode and the first electrode, and has a first opening that exposes the first region and the second region and a second opening that exposes the first electrode, and the second electrode may be formed on the second insulating film, connected to the first region and the second region in the first opening, and connected to the first electrode in the second opening.

In the semiconductor device according to a preferred embodiment of the present invention, the insulating film may have the same thickness as the gate insulating film.

In the semiconductor device according to a preferred embodiment of the present invention, the gate insulating film and the insulating film each may have a thickness of 300 Å to 700 Å.

The semiconductor device according to a preferred embodiment of the present invention may further include a pillar portion of the second conductivity type that is formed on the second surface side of the semiconductor layer with respect to the second region and extends in a thickness direction of the semiconductor layer.

That is, the semiconductor device may have a super junction structure. The super junction structure can reduce the ON resistance as compared with a device not including any super junction structure, however, the reverse current tends to be increased. However, according to a preferred embodiment of the present invention, it is possible to approach soft recovery characteristics and it is therefore possible to reduce the influence of an increase in reverse current on recovery characteristics.

In the semiconductor device according to a preferred embodiment of the present invention, the pillar portion may be formed continuously with the second region.

In the semiconductor device according to a preferred embodiment of the present invention, the one second region may include a first portion facing the gate electrode and a second portion facing the first electrode.

In the semiconductor device according to a preferred embodiment of the present invention, a plurality of the second regions may be arrayed on the semiconductor layer in a matrix pattern, the third region may be exposed from the first surface of the semiconductor layer as a lattice-shaped region between the second regions in the matrix pattern, the first electrode may straddle the adjacent second regions and covers the third region between the adjacent second regions, and the gate electrode may surround the first electrode and include a lattice-shaped portion covering the third region.

In the semiconductor device according to a preferred embodiment of the present invention, a plurality of the second regions may be arrayed on the semiconductor layer in a matrix pattern, the third region may be exposed from the first surface of the semiconductor layer as a lattice-shaped region between the second regions in the matrix pattern, the gate electrode and the first electrode each may be formed in a line shape extending along a row direction or a column direction of the second regions, and the gate electrode and the first electrode, each having the line shape, may extend parallel to each other and form a striped pattern as a whole.

In the semiconductor device according to a preferred embodiment of the present invention, a plurality of the second regions may be arrayed on the semiconductor layer in a striped pattern, the gate electrode and the first electrode each may be formed in a line shape extending along the second region, and the gate electrode and the first electrode, each having the line shape, may extend parallel to each other and form a striped pattern as a whole.

In the semiconductor device according to a preferred embodiment of the present invention, the gate electrode and the first electrode each may have a planar gate structure formed along the first surface of the semiconductor layer.

In the semiconductor device according to a preferred embodiment of the present invention, the semiconductor device may include a MISFET having the first region as a source region and the second region as a channel region.

The semiconductor device according to a preferred embodiment of the present invention may further include an IGBT including the first region as an emitter region, the second region as a base region, and a collector region of the second conductivity type in contact with the third region.

DETAILED DESCRIPTION OF PREFERRED
EMBODIMENTS OF PRESENT INVENTION

Next, the preferred embodiments of the present invention will be described in detail with reference to the accompanying drawings.

FIG. 1 is a schematic plan view of a semiconductor device 1 according to a preferred embodiment of the present invention.

The semiconductor device 1 has a rectangular shape in plan view. For example, a MISFET (metal insulator semiconductor field effect transistor) 2 is formed in the semiconductor device 1. An electrode film 3 is formed on the surface of the semiconductor device 1. The electrode film 3 covers almost the entire surface of the semiconductor device 1. In this preferred embodiment, the electrode film 3 includes a source electrode film 4 and a gate electrode film 5.

The source electrode film 4 is formed on almost the entire surface of the semiconductor device 1. A concave portion 6 is selectively formed in plan view in the source electrode film 4. In this preferred embodiment, the concave portion 6 is formed almost in the of one side of the semiconductor device 1.

The gate electrode film 5 integrally includes a pad portion 7 formed in the concave portion 6 of the source electrode film 4 in plan view and a finger portion 8 extending from the pad portion 7 along a side of the semiconductor device 1. In this preferred embodiment, the finger portion 8 is formed in a closed ring shape surrounding the source electrode film 4. As a matter of course, the finger portion 8 does not always have to be a closed ring shape. For example, the finger portion 8 may extend parallel along two sides (for example, the upper and lower sides in FIG. 1) of the semiconductor device 1 that face each other and have a terminal end at a corner portion of the semiconductor device 1.

Part of the electrode film 3 is covered by a passivation film 9 formed on the surface of the semiconductor device 1. The passivation film 9 covers the source electrode film 4 and the gate electrode film 5 altogether and has a plurality of openings 10 and 11 that expose parts of the electrode film 3. Referring to FIG. 1, part of the pad portion 7 of the gate electrode film 5 and the finger portion 8 are indicated by the broken lines, and this broken line portion is a portion covered by the passivation film 9. Although part of the source electrode film 4 is also covered, FIG. 1 omits illustration of the covered part.

Part of the source electrode film 4 is exposed as a source pad 12 from the first pad opening 10, and part (pad portion 7) of the gate electrode film 5 is exposed as a gate pad 13 from the second pad opening 11. A joining material such as a bonding wire, etc., may be joined to each pad when the semiconductor device 1 is packaged.

Figure 2:
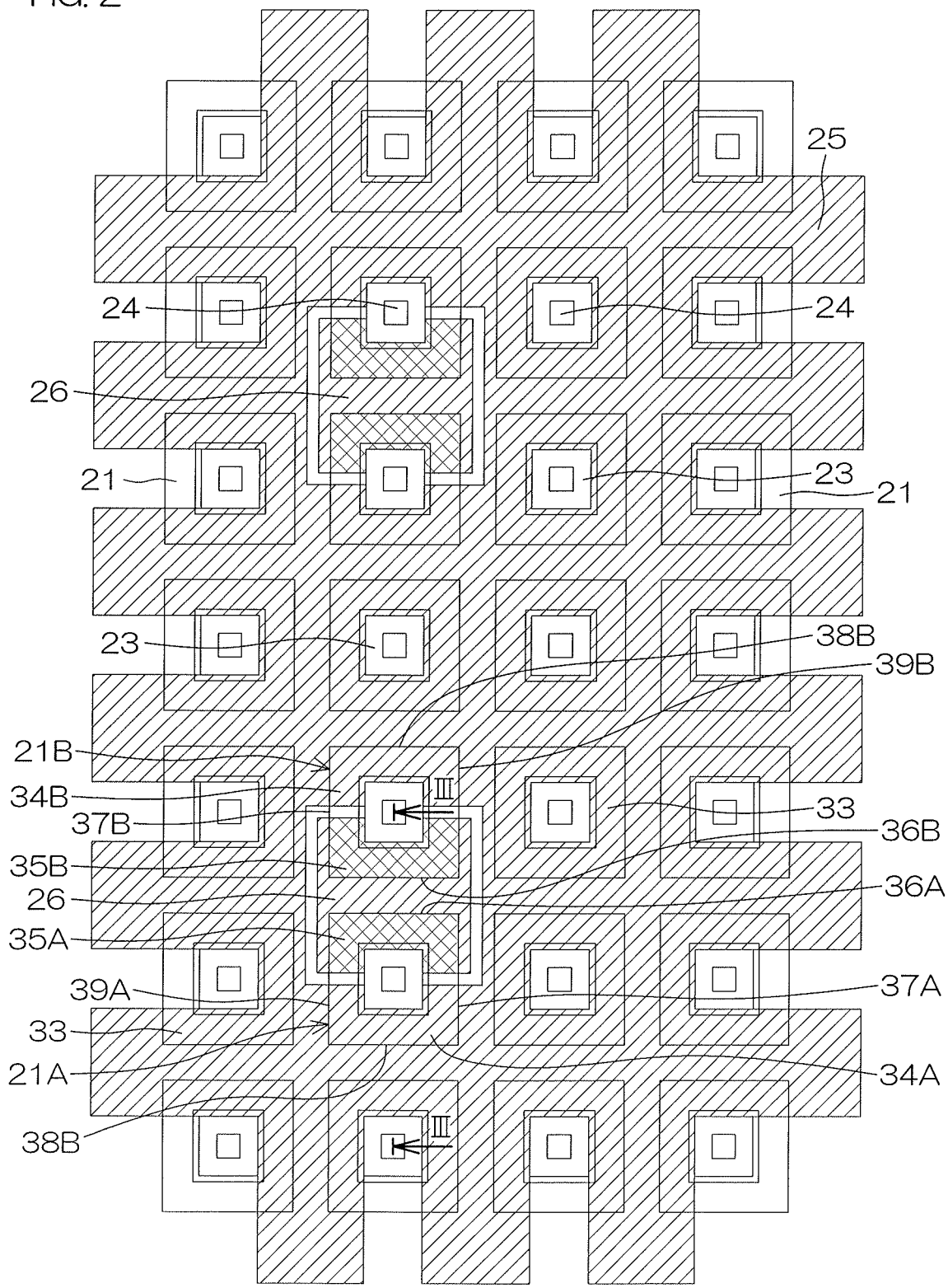
FIG. 2 is a view showing an array pattern of unit cells of the semiconductor device.
Figure 3:
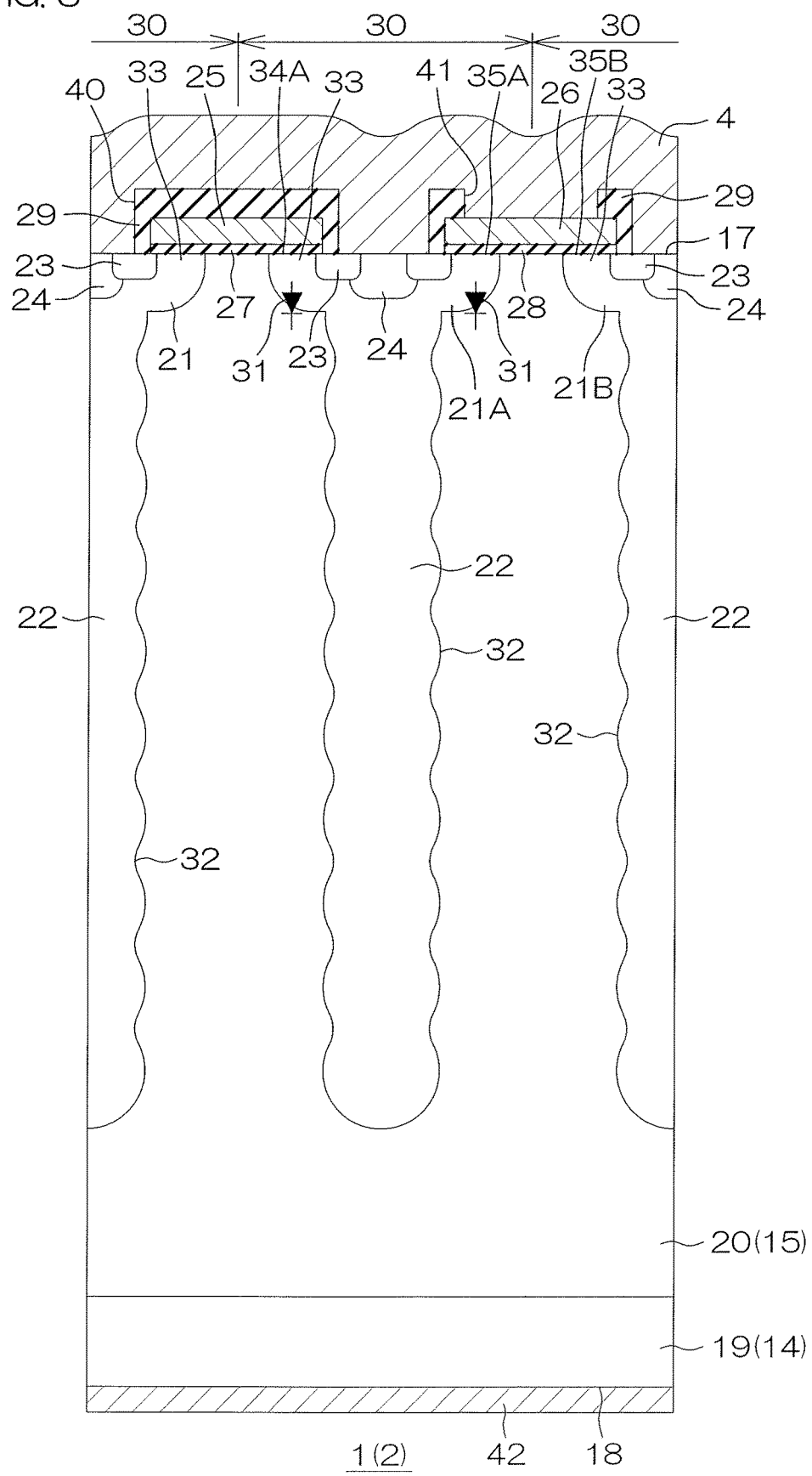
FIG. 3 is a sectional view showing section III-III in FIG. 2.

FIG. 2 shows an array pattern of unit cells of the semiconductor device 1. FIG. 3 is a sectional view showing section III-III in FIG. 2.

The semiconductor device 1 includes a semiconductor substrate 14 as an example of a semiconductor layer according to the present invention and an epitaxial layer 15 on the semiconductor substrate 14.

In this preferred embodiment, the semiconductor substrate 14 may be formed of an $n^+$ type semiconductor substrate (for example, a silicon substrate). Alternatively, the semiconductor substrate 14 may be a substrate generally used for a transistor, such as an SiC substrate or a GaN substrate, etc. The $n^+$ type semiconductor substrate 14 may be a semiconductor substrate that undergoes crystal growth while being doped with an n type impurity. As an n type impurity, for example, P (phosphorus), As (arsenic), or SB (antimony), etc., can be used. The $n^+$ type semiconductor substrate 14 may have an impurity concentration of, for example, about $1.0\times10^{18}$ cm$^{-3}$ to $5.0\times10^{20}$ cm$^{-3}$.

The epitaxial layer 15 may be an $n^-$ type layer epitaxially grown on the $n^+$ type semiconductor substrate 14 while being doped with an n type impurity. As an n type impurity, one of the above-mentioned materials can be used. The $n^-$ type epitaxial layer 15 may have an impurity concentration of, for example, about $1.0\times10^{10}$ cm$^{-3}$ to $1.0\times10^{16}$ cm$^{-3}$, which is lower than that of the $n^+$ type semiconductor substrate 14.

The semiconductor device 1 includes the n channel type MISFET 2 having a super junction structure. The MISFET 2 is a vertical structure element in which a current flows between the front surface (a first surface 17) of the epitaxial layer 15 and the rear surface (a second surface 18) of the semiconductor substrate 14 in the thickness direction of these surfaces.

The MISFET 2 includes an $n^+$ type drain layer 19, an $n^-$ type drift layer 20 as an example of a third region according to the present invention, a p type channel region 21 as an example of a second region according to the present invention, a p type pillar layer 22, an $n^+$ type source region 23 as an example of a first region according to the present invention, a $p^+$ type channel contact region 24, a gate electrode 25, a dummy gate electrode 26 as an example of a first electrode according to the present invention, a first gate insulating film 27 as an example of a gate insulating film according to the present invention, a second gate insulating film 28 as an example of an insulating film according to the present invention, and an interlayer insulating film 29 as an example of a second insulating film according to the present invention.

The $n^+$ type drain layer 19 may be formed of the semiconductor substrate 14 described above, and the $n^-$ type drift layer 20 may be formed of the epitaxial layer 15 described above.

The p type channel region 21 is a semiconductor layer implanted with a p type impurity. More specifically, it may be a semiconductor layer formed by ion implantation of a p type impurity with respect to the $n^-$ type drift layer 20. As a p type impurity, for example, B (boron), Al (aluminum), or Ga (gallium), etc., can be used. The p type channel region 21 may have an impurity concentration of, for example, about $1.0\times10^{15}$ cm$^{-3}$ to $1.0\times10^{19}$ cm$^{-3}$.

The p type channel region 21 is selectively formed in the first surface 17 of the $n^-$ type drift layer 20. In this preferred embodiment, as shown in FIG. 2, the plurality of p type channel regions 21 are arrayed in a matrix pattern. Each p type channel region 21 has a rectangular shape in plan view, which may have, for example, a width of 3 µm to 10 µm. A region including each p type channel region 21 and the $n^-$ type drift layer 20 surrounding the p type channel region 21 constitute a unit cell 30. That is, according to the layout shown in FIG. 2, the semiconductor device 1 includes many (a plurality of) unit cells 30 arrayed in a matrix pattern in plan view. The $n^-$ type drift layer 20 is exposed from the first surface 17 of the epitaxial layer 15 as a lattice-shaped region between the p type channel regions 21 in a matrix pattern. In addition, as shown in FIG. 3, each p type channel region 21 forms a parasitic diode 31 (body diode) at an interface (pn junction surface) with the $n^-$ type drift layer 20.

The p type pillar layer 22 may be a semiconductor layer formed by ion implantation of a p type impurity into the $n^-$ type drift layer 20. As a p type impurity, one of the above-mentioned materials can be used. In addition, the p type pillar layer 22 may have the same impurity concentration as that of the p type channel region 21.

The p type pillar layer 22 is formed in a region inside the p type channel region 21 of each unit cell 30. More specifically, the p type pillar layer 22 is formed continuously with the center of the p type channel region 21 in the width direction and extends from the p type channel region 21 toward the $n^+$ type drain layer 19. The p type pillar layer 22 forms a super junction structure in the MISFET 2.

Although not shown, the planar shapes of the p type pillar layers 22 may constitute a matrix pattern similar to that of the p type channel regions 21. That is, the p type pillar layer 22 may have a rod shape extending from the p type channel region 21 having a rectangular shape in plan view toward the $n^+$ type drain layer 19. Note that the p type pillar layer 22 may be formed continuously with the p type channel region 21 as shown in FIG. 3 or may be a divided pillar layer separated from the p type channel region 21 toward the second surface 18 side of the semiconductor substrate 14.

When the p type channel region 21 is divided from the p type pillar layer 22, part of the n⁻ type drift layer 20 is interposed between them.

A side surface 32 of each p type pillar layer 22 along a thickness direction of the n⁻ type drift layer 20 is formed as a concave/convex surface periodically undulating along the depth direction. In general, the number of concaves/convexes is substantially equal to the number of steps of an n type semiconductor layer 44 (FIG. 4A) to be described later.

The n⁺ type source region 23 is formed in an inward region of the p type channel region 21 of each unit cell 30. The n⁺ type source region 23 is selectively formed in a surface portion of the p type channel region 21 in the inward region. The n⁺ type source region 23 may be formed by selective ion implantation of an n type impurity into the p type channel region 21. Examples of such an n type impurity are those described above. The n⁺ type source region 23 may have an impurity concentration of, for example, about $1.0\times10^{18}$ cm⁻³ to $5.0\times10^{20}$ cm⁻³, which is higher than that of the n⁻ type drift layer 20.

The n⁺ type source region 23 has a rectangular shape in plan view and is separated inwardly from the peripheral edge (the interface between the p type channel region 21 and the n⁻ type drift layer 20) of the p type channel region 21 by a predetermined distance. Thereby, a surface portion of the p type channel region 21 is interposed between the n⁺ type source region 23 and the n⁻ type drift layer 20 in a surface layer region of a semiconductor layer including the n⁻ type drift layer 20 and the p type channel region 21, and this interposed surface portion provides a channel formation portion 33 of the MISFET 2.

The p⁺ type channel contact region 24 has a rectangular shape in plan view and is formed in a region directly above the p type pillar layer 22. The p⁺ type channel contact region 24 is selectively formed in a surface portion of the p type channel region 21 in this region. The p⁺ type channel contact region 24 may be formed by selective ion implantation of a p type impurity into the p type channel region 21. Examples of such a p type impurity are those described above. In addition, the p⁺ type channel contact region 24 may have an impurity concentration of, for example, about $5.0\times10^{17}$ cm⁻³ to $1.0\times10^{19}$ cm⁻³, which is higher than that of the p type channel region 21.

The p⁺ type channel contact region 24 extends toward the n⁺ type drain layer 19 through the n⁺ type source region 23 so as to reach the p type channel region 21.

Referring to FIG. 2, the patterns of the gate electrodes 25 and the dummy gate electrodes 26 are formed in the hatched region. Note that FIG. 2 omits illustration of part of the gate electrode 25 at the peripheral edge of each of unit cell 30 in a matrix pattern shown in FIG. 2, and shows a mode where part of each p type channel region 21 is not covered by the gate electrode 25.

First, in this preferred embodiment, each dummy gate electrode 26 straddles the mutually adjacent p type channel regions 21 and covers the n⁻ type drift layer 20 between them. For example, referring to FIG. 2, one pair of p type channel regions 21 covered by the dummy gate electrode 26 are respectively defined as a p type channel region 21A and a p type channel region 21B. The p type channel region 21A and the p type channel region 21B are adjacent to each other. That is, in plan view, the p type channel region 21A and the p type channel region 21B face each other across the n⁻ type drift layer 20.

In plan view, the p type channel region 21A may include a first portion 34A formed on a side opposite to the p type channel region 21B and a second portion 35A formed on the p type channel region 21B side (a side opposite to the first portion 34A). Likewise, in plan view, the p type channel region 21B may include a first portion 34B formed on a side opposite to the p type channel region 21A and a second portion 35B formed on the p type channel region 21A side (a side opposite to the first portion 34B). That is, in terms of the relationship between the p type channel region 21A and the p type channel region 21B, the second portion 35A and the second portion 35B face each other across the n⁻ type drift layer 20.

In this preferred embodiment, because the p type channel region 21A has a rectangular shape in plan view, the second portion 35A of the p type channel region 21A may be the portion (indicated by crosshatching in FIG. 2) defined by a first side 36A facing the p type channel region 21B and line segments extending from the first side 36A to the centers of one pair of a second side 37A and a fourth side 39A continuous with the first side 36A. Accordingly, the first portion 34A of the p type channel region 21A may be the portion defined by a third side 38A facing the first side 36A and line segments extending from the third side 38A to the centers of one pair of the second side 37A and the fourth side 39A continuous with the third side 38A.

In addition, because the p type channel region 21B has a rectangular shape in plan view, the second portion 35B of the p type channel region 21B may be the portion (indicated by crosshatching in FIG. 2) defined by a first side 36B facing the p type channel region 21A and line segments extending from the first side 36B to the centers of one pair of a second side 37B and a fourth side 39B continuous with the first side 36B. Accordingly, the first portion 34B of the p type channel region 21B may be the portion defined by a third side 38B facing the first side 36B and line segments extending from the third side 38B to the centers of one pair of the second side 37B and the fourth side 39B continuous with the third side 38B.

Note that when the p type channel region 21A and the p type channel region 21B each has a shape other than a rectangular shape, for example, a polygonal shape or circuit shape, etc., the first portions 34A and 34B and the second portions 35A and 35B of the p type channel region 21A and the p type channel region 21B may be set as appropriate in accordance with the shape of each channel region. When, for example, the p type channel region 21A has a circular shape, the portion defined by a semicircular portion facing the p type channel region 21B may be set as the second portion 35A, and the portion defined by the remaining semicircular portion may be the first portion 34A.

Each dummy gate electrode 26 straddles the second portion 35A of the p type channel region 21A and the second portion 35B of the p type channel region 21B, which are adjacent to each other, and covers the second portions 35A and 35B. Thereby, the second portions 35A and 35B of the p type channel region 21A and the p type channel region 21B selectively face the dummy gate electrode 26. A portion of the n⁻ type drift layer 20 which is sandwiched between the p type channel region 21A and the p type channel region 21B is also covered by the dummy gate electrode 26 and faces the dummy gate electrode 26.

On the other hand, the first portion 34A and the first portion 34B of the p type channel region 21A and the p type channel region 21B are portions that are not covered by the dummy gate electrode 26. In this preferred embodiment, the first portions 34A and 34B of the p type channel region 21A and the p type channel region 21B are covered by the gate electrode 25 and face the gate electrode 25. That is, one p type channel region 21A or 21B has both the first portion 34A or 34B facing the gate electrode 25 and the second portion 35A or 35B facing the dummy gate electrode 26.

The gate electrode 25 is physically separated from the dummy gate electrode 26. Referring to FIG. 2, the gate electrode 25 surrounds the island-shaped dummy gate electrode 26 and includes a lattice-shaped portion covering the n⁻ type drift layer 20 between the p type channel regions 21 in a matrix pattern which are not covered by the dummy gate electrode 26.

The gate electrode 25 and the dummy gate electrode may be made of polysilicon formed by, for example, implantation of an impurity.

The first gate insulating film 27 may be formed of, for example, a silicon oxide film, silicon nitride film, silicon oxynitride film, hafnium oxide film, alumina film, tantalum oxide film, or the like. When the first gate insulating film 27 is formed of a silicon oxide film, the MISFET 2 may be called a MOSFET (metal oxide semiconductor field effect transistor).

The first gate insulating film 27 covers at least the surface of the p type channel region 21. In this preferred embodiment, the first gate insulating film 27 covers part of the surface of the n⁺ type source region 23 and the surfaces of the channel formation portion 33 and the n⁻ type drift layer 20. In other words, the first gate insulating film 27 is formed of a pattern having openings in part of the p⁺ type channel contact region 24 of each unit cell 30 and part of the n⁺ type source region 23 continuous with the p⁺ type channel contact region 24.

The first gate insulating film 27 is interposed between the gate electrode 25 and the epitaxial layer 15. Thereby, the gate electrode 25 faces the channel formation portion 33 through the first gate insulating film 27. The gate electrodes 25 is formed in almost the same pattern as that of the first gate insulating film 27, thereby forming a planar gate structure. The first gate insulating film 27 may have a thickness of, for example, 300 Å to 700 Å.

The second gate insulating film 28 may be formed of, for example, a silicon oxide film, silicon nitride film, silicon oxynitride film, hafnium oxide film, alumina film, tantalum oxide film, or the like.

The second gate insulating film 28 covers at least the surfaces of the p type channel regions 21A and 21B (the surfaces of the second portions 35A and 35B in this preferred embodiment). In this preferred embodiment, the second gate insulating film 28 covers part of the surface of the n⁺ type source region 23 and the surfaces of the channel formation portion 33 and the n⁻ type drift layer 20. In other words, the second gate insulating film 28 is formed of a pattern having openings in part of the p⁺ type channel contact region 24 of each unit cell 30 and part of the n⁺ type source region 23 continuous with the p⁺ type channel contact region 24. The second gate insulating film 28 may have the same thickness as that of the first gate insulating film 27. The second gate insulating film 28 may have a thickness of, for example, 300 Å to 700 Å.

The second gate insulating film 28 is interposed between the dummy gate electrode 26 and the epitaxial layer 15. Thereby, the dummy gate electrode 26 faces the channel formation portion 33 through the second gate insulating film 28. Note, however, that because gate voltage is not applied to the dummy gate electrode 26, no channel is formed at a portion of the channel formation portion 33 which faces the dummy gate electrode 26 when the semiconductor device 1 is turned on.

The interlayer insulating film 29 is formed on the epitaxial layer 15. The interlayer insulating film 29 covers the gate electrode 25 and the dummy gate electrode 26. The interlayer insulating film 29 may be formed of an insulating material, for example, a silicon oxide film, silicon nitride film, or TEOS (tetraethoxysilane), etc.

In the interlayer insulating film 29, a first contact hole 40 as an example of a first opening according to the present invention which exposes the p⁺ type channel contact region 24 and the n⁺ type source region 23 of the MISFET 2 and a second contact hole 41 as an example of a second opening according to the present invention which exposes the dummy gate electrode 26 are formed. The first contact hole 40 penetrates through the interlayer insulating film 29 and the first gate insulating film 27.

The electrode film 3 described above is formed on the interlayer insulating film 29. The electrode film 3 may be made of aluminum or another type of metal. FIG. 3 shows the source electrode film 4 as an example of a second electrode according to the present invention. Note that the source electrode film 4 may be simply called a source electrode.

Referring to FIG. 3, the source electrode film 4 is connected to the p⁺ type channel contact region 24 and the n⁺ type source region 23 in the first contact hole 40 and connected to the dummy gate electrode 26 in the second contact hole 41. That is, the dummy gate electrode 26 is sandwiched between the n⁻ type drift layer 20 of the epitaxial layer 15 and the source electrode film 4 as a contact electrode in the thickness direction of the epitaxial layer 15. In other words, a contact portion of the source electrode film 4 with respect to the dummy gate electrode 26 faces the n⁻ type drift layer 20 through the dummy gate electrode 26.

Thereby, the source electrode film 4 connects the p type channel region 21 and the n⁺ type source region 23 of the unit cell 30 (an active cell that can make a current flow between the drain and the source) functioning as the MISFET 2 in parallel with the dummy gate electrode 26 of the unit cell 30 (an inactive cell that cannot make a current flow between the drain and the source) that does not function as the MISFET 2. Note that each gate electrode film 5 is connected to the gate electrode 25 at a position (not shown).

A drain electrode 42 as an example of a third electrode according to the present invention is formed on the second surface 18 of the semiconductor substrate 14. The drain electrode 42 may be made of aluminum or another type of metal. The drain electrode 42 is connected to the n⁺ type drain layer 19 in the second surface 18 of the semiconductor substrate 14. Thereby, the drain electrode 42 is electrically connected to the n⁻ type drift layer 20 through the n⁺ type drain layer 19.

FIGS. 4A to 4I show sequential steps in a process for manufacturing the semiconductor device 1.

Referring to FIG. 4A, in order to manufacture the semiconductor device 1, first, an initial base layer 43 is formed on the semiconductor substrate 14 (n⁺ type drain layer 19). Next, a plurality of n type semiconductor layers 44 are stacked on the initial base layer 43 by multi-epitaxial growth, in which a process of forming the n type semiconductor layer 44 is repeated while selectively implanting a p type impurity at positions at which the p type pillar layers 22 are to be formed. Thereby, the plurality of n type semiconductor layers 44 is integrated with the initial base layer 43 to form the epitaxial layer 15 (n⁻ type drift layer 20).

Figure 4B:
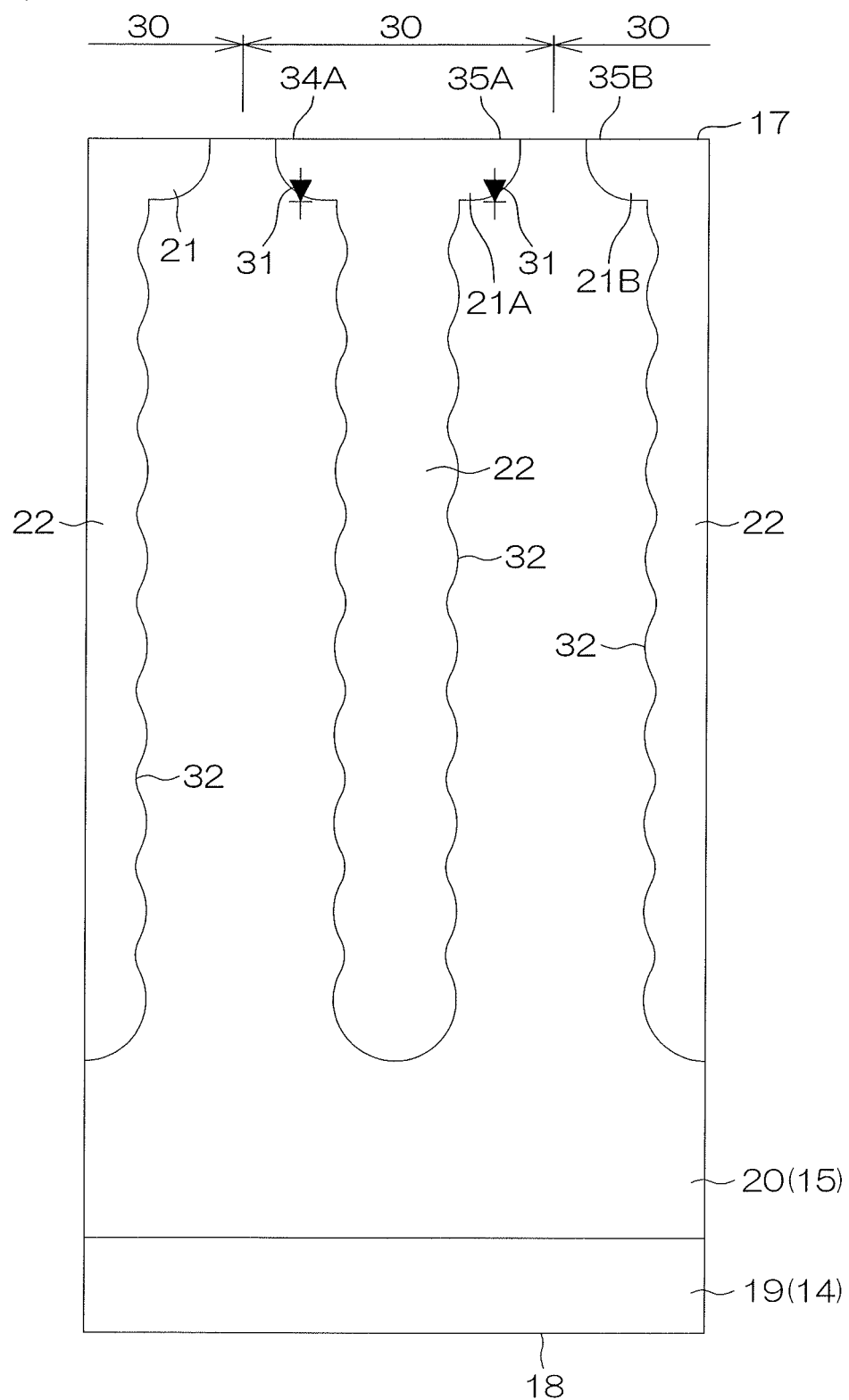
FIGS. 4A to 4I are views each showing part of a process for manufacturing the semiconductor device.

Next, an annealing process (1000° C. to 1200° C.) is performed to perform drive diffusion of the p type impurity in the plurality of n type semiconductor layers 44. Thereby, the p type pillar layers 22 is formed in the epitaxial layer 15, as shown in FIG. 4B. A p type impurity is then selectively implanted into the surface portion of the n⁻ type drift layer 20 to form the p type channel regions 21.

Figure 4C:
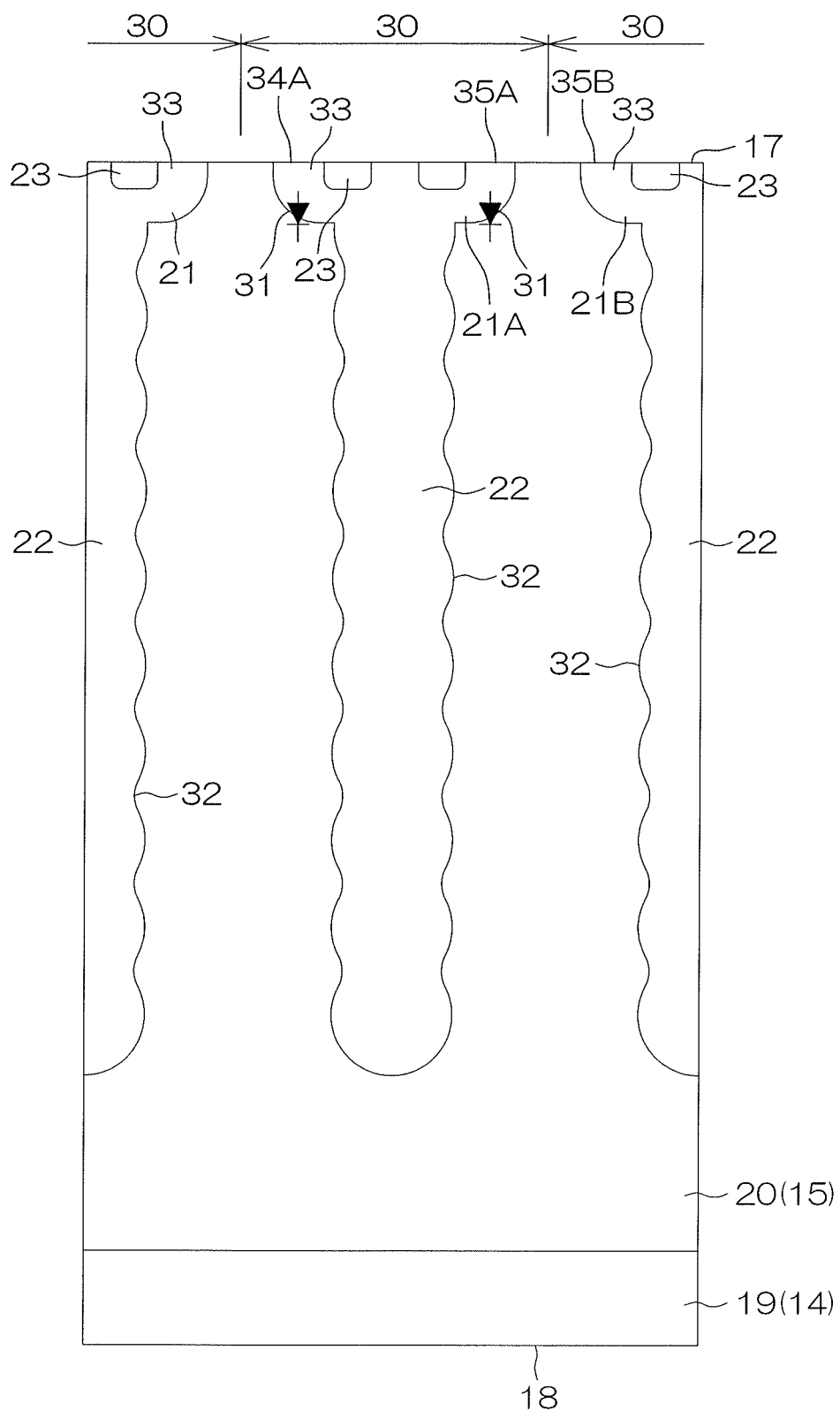

Next, referring to FIG. 4C, an n type impurity is selectively implanted into the surface portion of the p type channel region 21 to form the n⁺ type source regions 23.

Next, referring to FIG. 4D, a p type impurity is selectively implanted into the surface portion of the p type channel region 21 to form the p⁺ type channel contact regions 24.

Figure 4E:
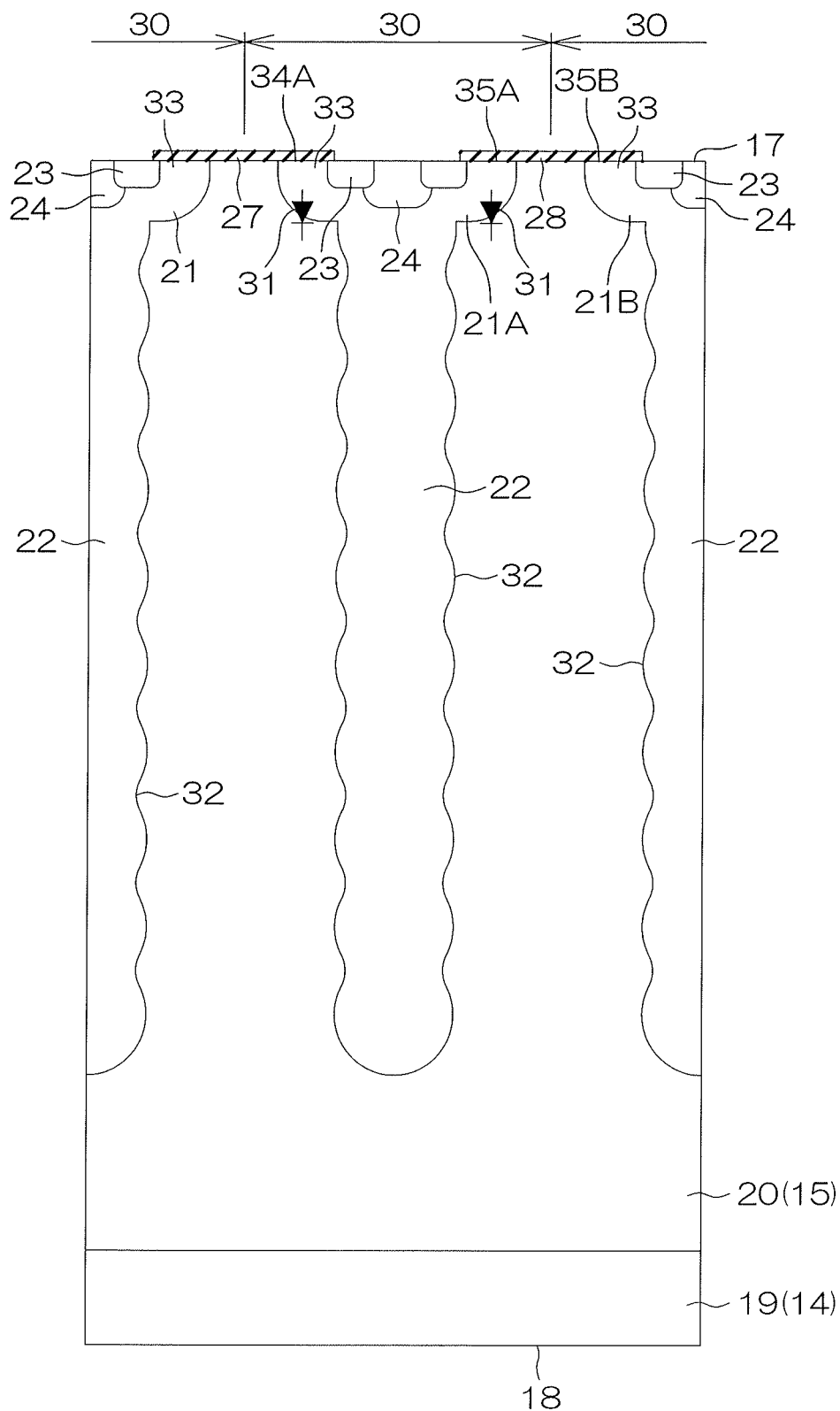

Next, referring to FIG. 4E, the first gate insulating film 27 and the second gate insulating film 28 are formed on the epitaxial layer 15. The first gate insulating film 27 and the second gate insulating film 28 each may be formed by growing an oxide film by thermal oxidation of a semiconductor crystal surface and then patterning the oxide film.

Figure 4F:
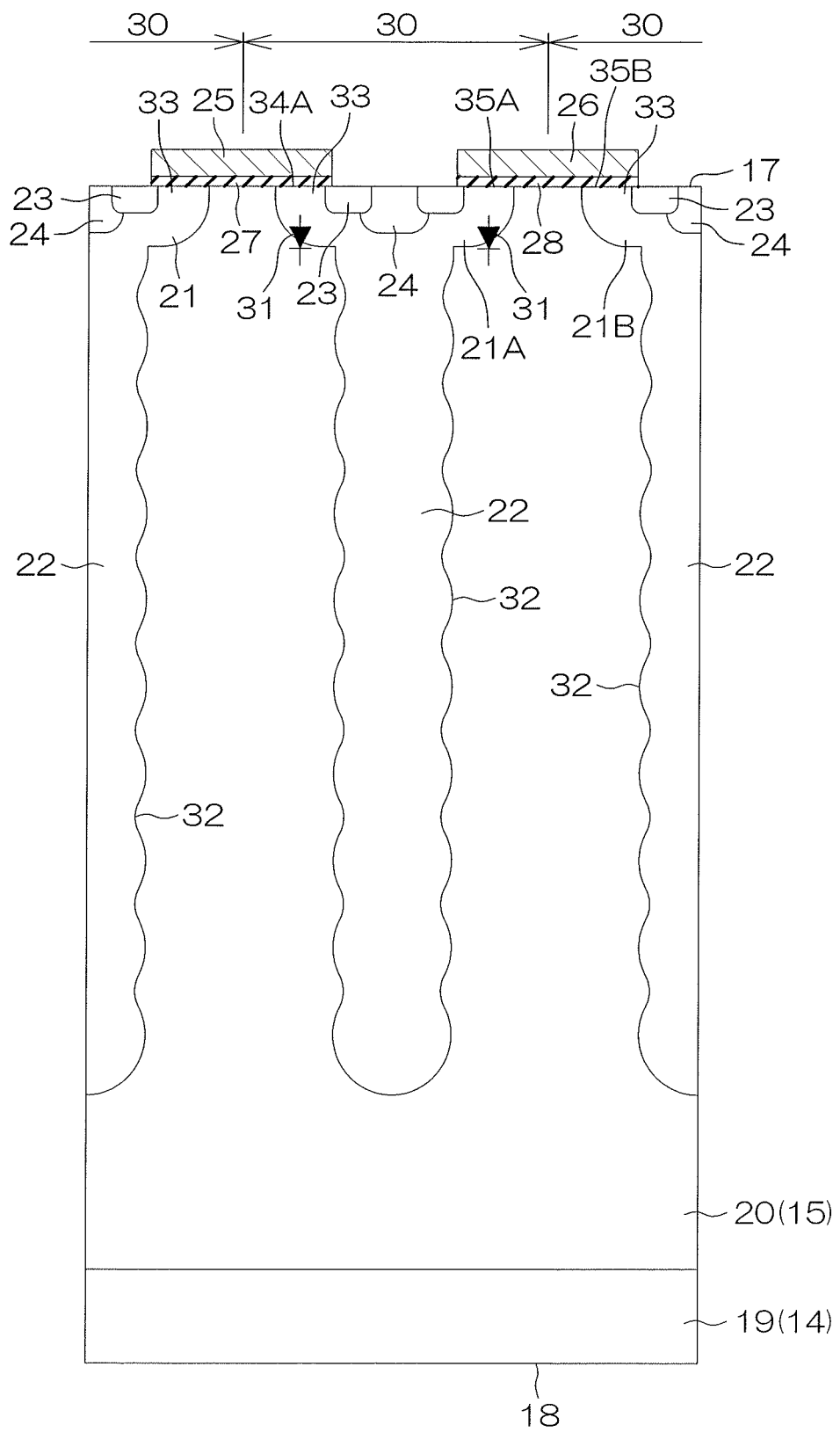

Next, referring to FIG. 4F, the gate electrode 25 is formed on the first gate insulating film 27, and the dummy gate electrode 26 is formed on the second gate insulating film 28. The gate electrode 25 and the dummy gate electrode 26 each may be formed by, for example, forming an impurity-doped polysilicon film on the entire surface and then selectively etching the polysilicon film by photolithography.

Figure 4G:
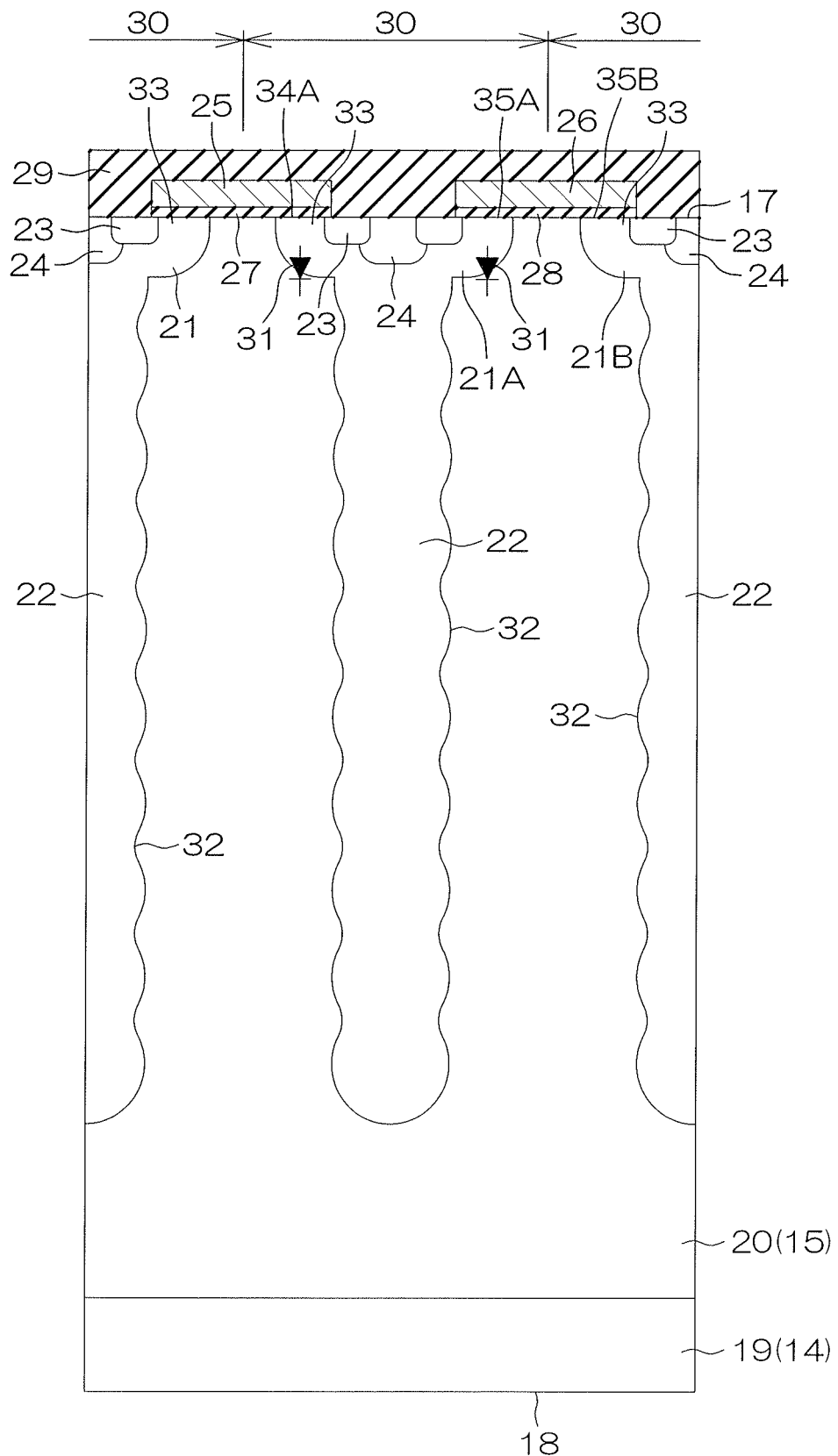

Next, referring to FIG. 4G, the interlayer insulating film 29 is formed so as to cover the gate electrode 25 and the dummy gate electrode 26.

Figure 4H:
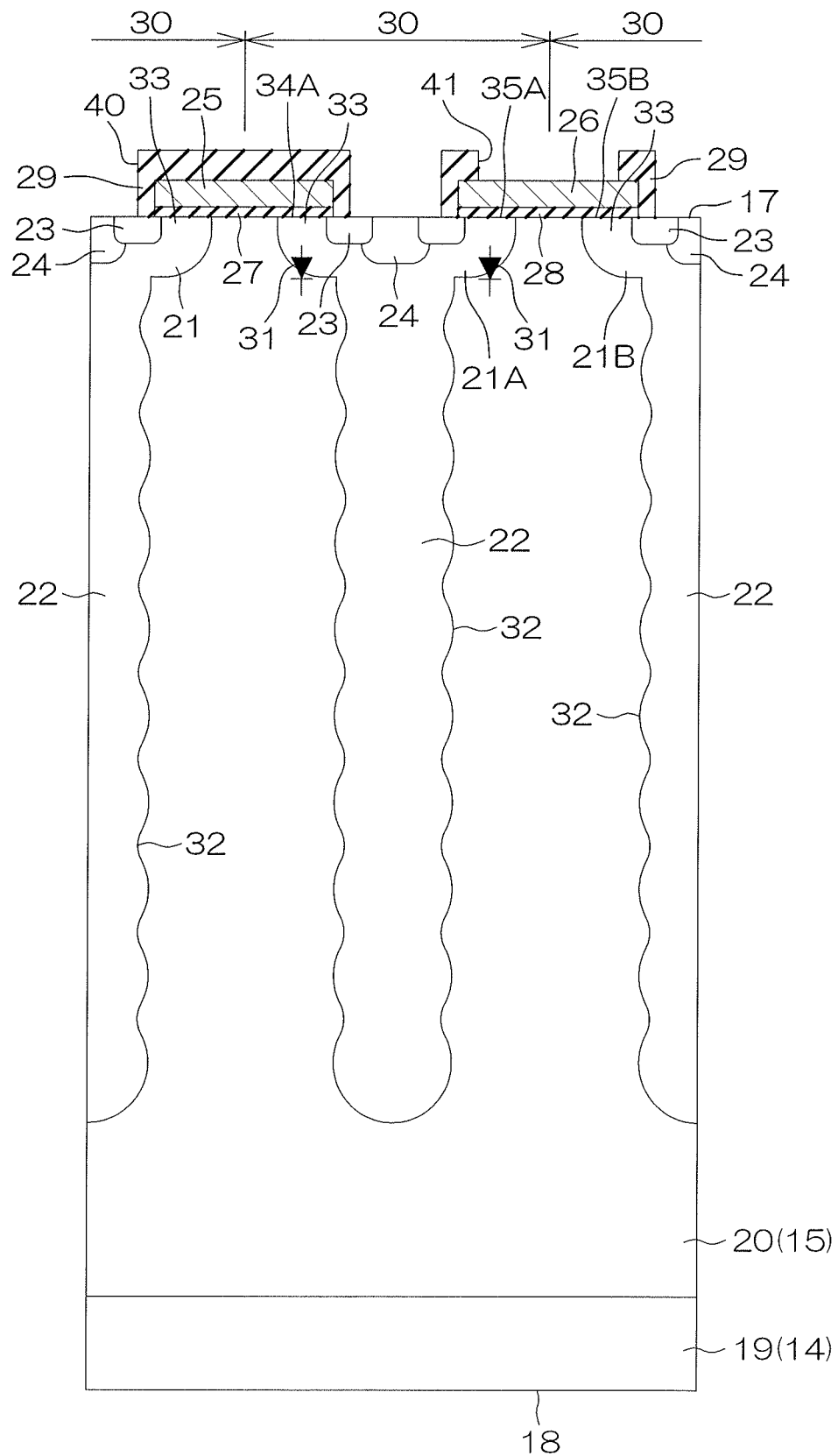
Figure 4:
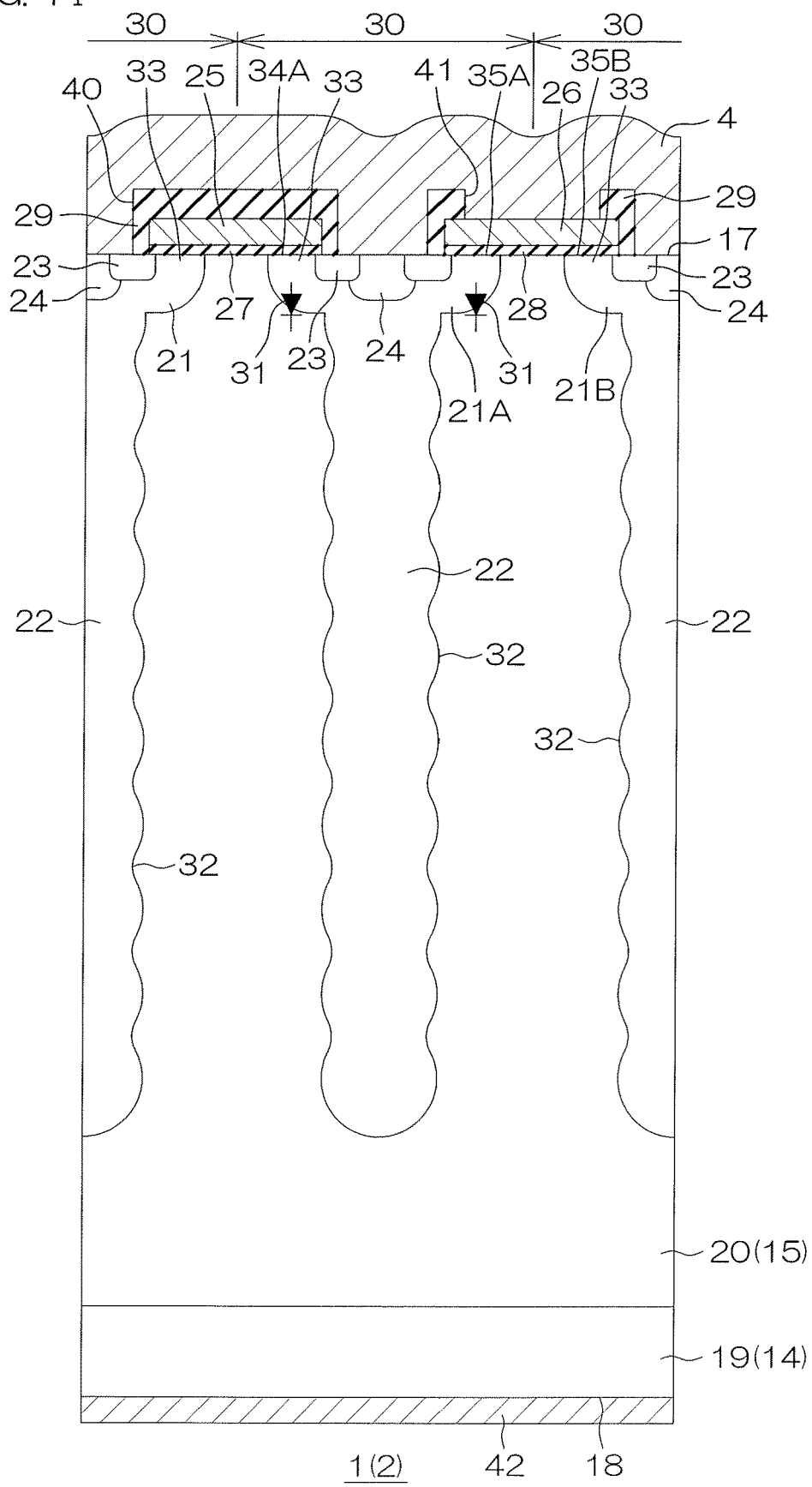

Next, referring to FIG. 4H, the first contact hole 40 and the second contact hole 41 are formed in the interlayer insulating film 29 by photolithography.

Next, referring to FIG. 4I, the source electrode film 4 and the gate electrode film 5 are formed on the interlayer insulating film 29. The passivation film 9 (not shown) is then formed so as to cover the source electrode film 4 and the gate electrode film 5. The pad openings 10 and 11 are formed in the passivation film 9 by photolithography.

Thereafter, by forming the drain electrode 42 on the second surface 18 of the semiconductor substrate 14 (n⁺ type drain layer 19), the semiconductor device 1 shown in FIGS. 1 to 3 can be obtained.

Next, the operation of the MISFET 2 will be described. When a DC power supply is connected between the source electrode film 4 and the drain electrode 42 with the drain electrode 42 being set on the high-potential side and the source electrode film 4 being set on the low-potential side, a reverse bias is applied to the parasitic diode 31 formed by the pn junction between the p type channel region 21 and the n⁻ type drift layer 20. When a control voltage lower than a predetermined threshold voltage is applied to the gate electrode 25 at this time, no current path is formed between the drain and the source. That is, the MISFET 2 is put in an OFF state (normally-OFF).

On the other hand, when a control voltage equal to or higher than the threshold voltage is applied to the gate electrode 25, the surface of the channel formation portion 33 attracts electrons to form an inversion layer (channel). Thereby, conduction between the n⁺ type source region 23 and the n⁻ type drift layer 20 is established. That is, a current path is formed which extends from the source electrode film 4 to the drain electrode 42 through the n⁺ type source region 23, the inversion layer of the channel formation portion 33, and the n⁻ type drift layer 20. That is, the MISFET 2 is put in an ON state.

For example, when the MISFET 2 is applied to an inverter circuit that drives an inductive load such as an electric motor, etc., the source electrode film 4 becomes higher in potential than the drain electrode 42 and the parasitic diode 31 is turned on to make a current flow through the parasitic diode 31 in some cases. Subsequently, when the source electrode film 4 becomes lower in potential than the drain electrode 42, the parasitic diode 31 is reversely biased and turned off. When the parasitic diode 31 is turned off, a depletion layer extends from the pn junction portion of the parasitic diode 31, carriers (holes) in the p type channel region 21 and the p type pillar layer 22 move to the source electrode film 4 side, and carriers (electrons) in the n⁻ type drift layer 20 move to the drain electrode 42 side.

As the carriers move in this manner, a current flows in the direction opposite to that when the parasitic diode 31 is in the ON state. This current is called a reverse recovery current. In general, the reverse recovery current temporarily increases and then decreases. The time from when the forward current in the diode becomes zero to when the magnitude of the reverse recovery current decreases to 10% of its maximum value is called a reverse recovery time. When the change (dir/dt) in reverse recovery current is large, oscillation (ringing) may occur before the current converges to zero. Such a reverse recovery characteristic is called hard recovery and is a cause of noise and malfunction.

Here, in a recovery phenomenon, the main cause of reverse recovery charge generated when the parasitic diode 31 is turned off from the ON operation of the parasitic diode 31 is holes which are minority carriers existing in the n⁻ type drift layer 20. The time taken to sweep out the holes to the source electrode film 4 is called the reverse recovery time and a countermeasure to eliminate the holes is lifetime control. Accordingly, with regard to the operation time of the parasitic diode 31 (the time during which the source electrode film 4 is higher in potential than the drain electrode 42), hard recovery is expected to be improved by advancing the timing at which a depletion layer extends after minority carriers are swept out.

According to this preferred embodiment, because the source electrode film 4 is connected to the dummy gate electrode 26, the density of holes in the n⁻ type drift layer 20 in the first surface 17 of the epitaxial layer 15 locally decreases when the parasitic diode 31 is turned off. This facilitates a depletion layer to extend in the first surface 17 of the epitaxial layer 15 and it is made possible to advance the timing at which the depletion layer extends. This allows the depletion layer to gradually extend in the first surface 17 of the epitaxial layer 15. As a result, it is possible to make a reverse current flowing in the parasitic diode 31 slowly return to zero when the parasitic diode 31 is turned off, thereby making the reverse recovery characteristics of the parasitic diode 31 approach soft recovery characteristics.

On the other hand, the MISFET 2 having a super junction structure like the MISFET 2 according to this preferred embodiment can reduce the ON resistance as compared with the MISFET 2 not including any super junction structure, however, the reverse current tends to be increased. However, according to the arrangement of the preferred embodiment, it is possible to approach soft recovery characteristics and it is therefore possible to reduce the influence of an increase in reverse current on recovery characteristics.

Figure 5:
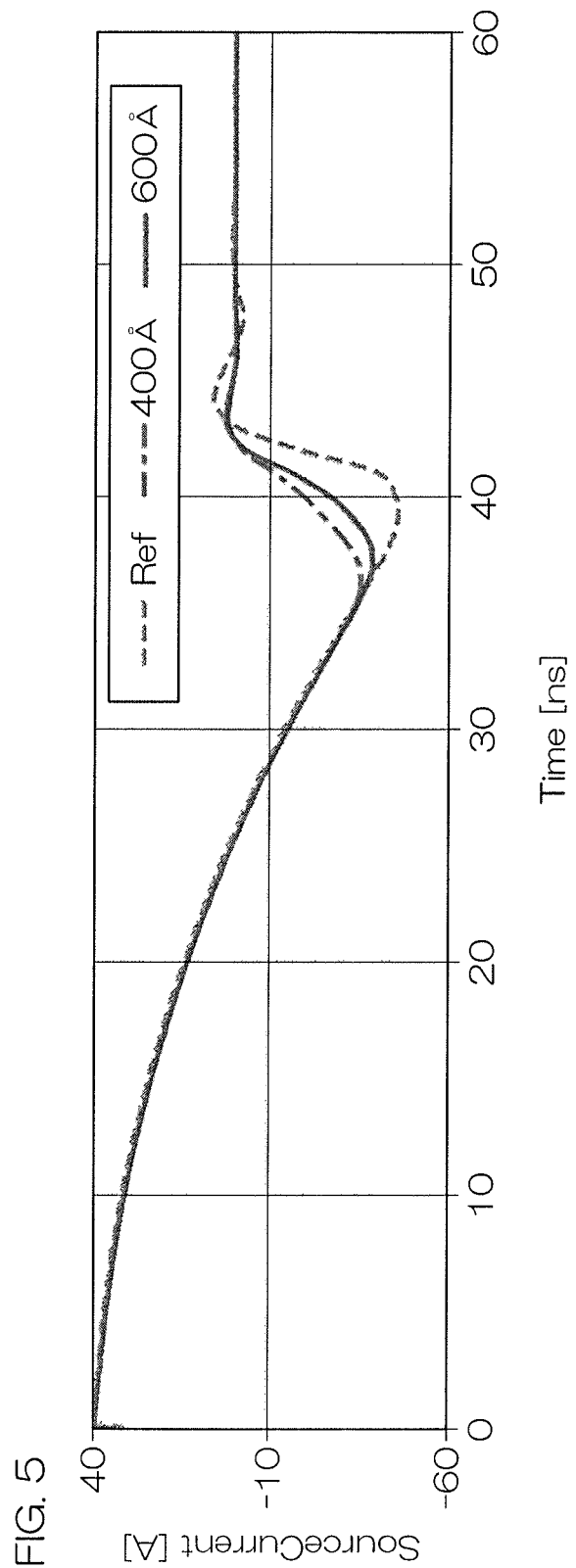
FIG. 5 is a graph showing simulation results (source currents) concerning recovery characteristics.
Figure 6:
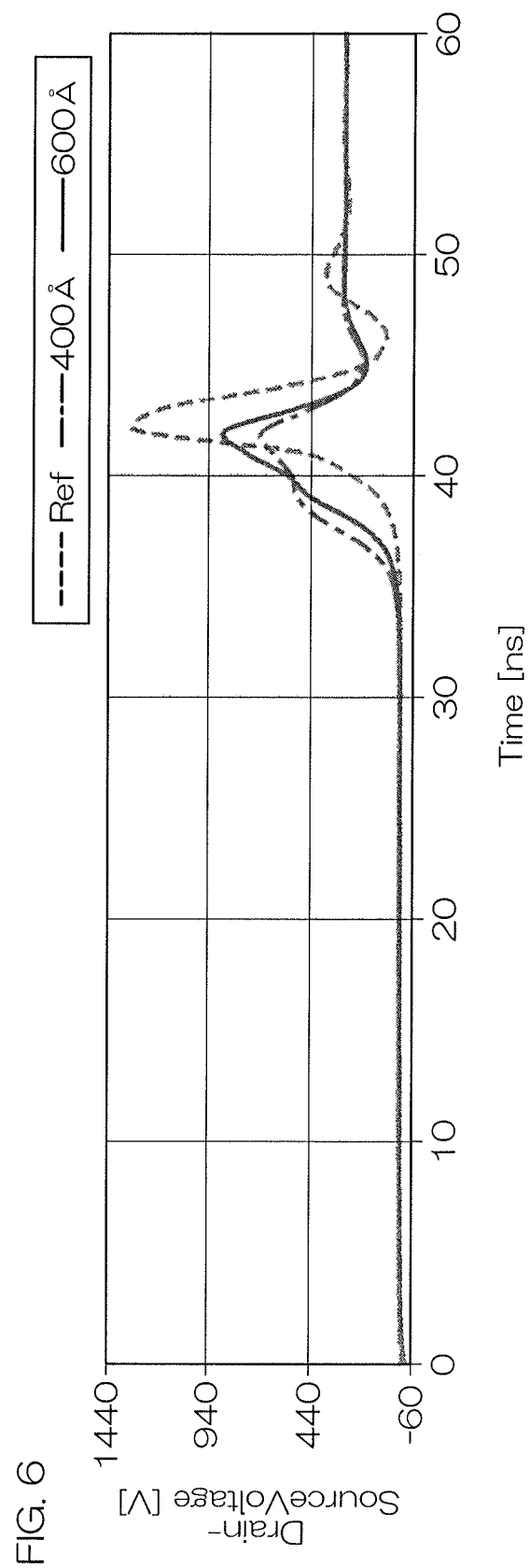
FIG. 6 is a graph showing simulation results (drain-source voltages) concerning recovery characteristics.
Figure 7:
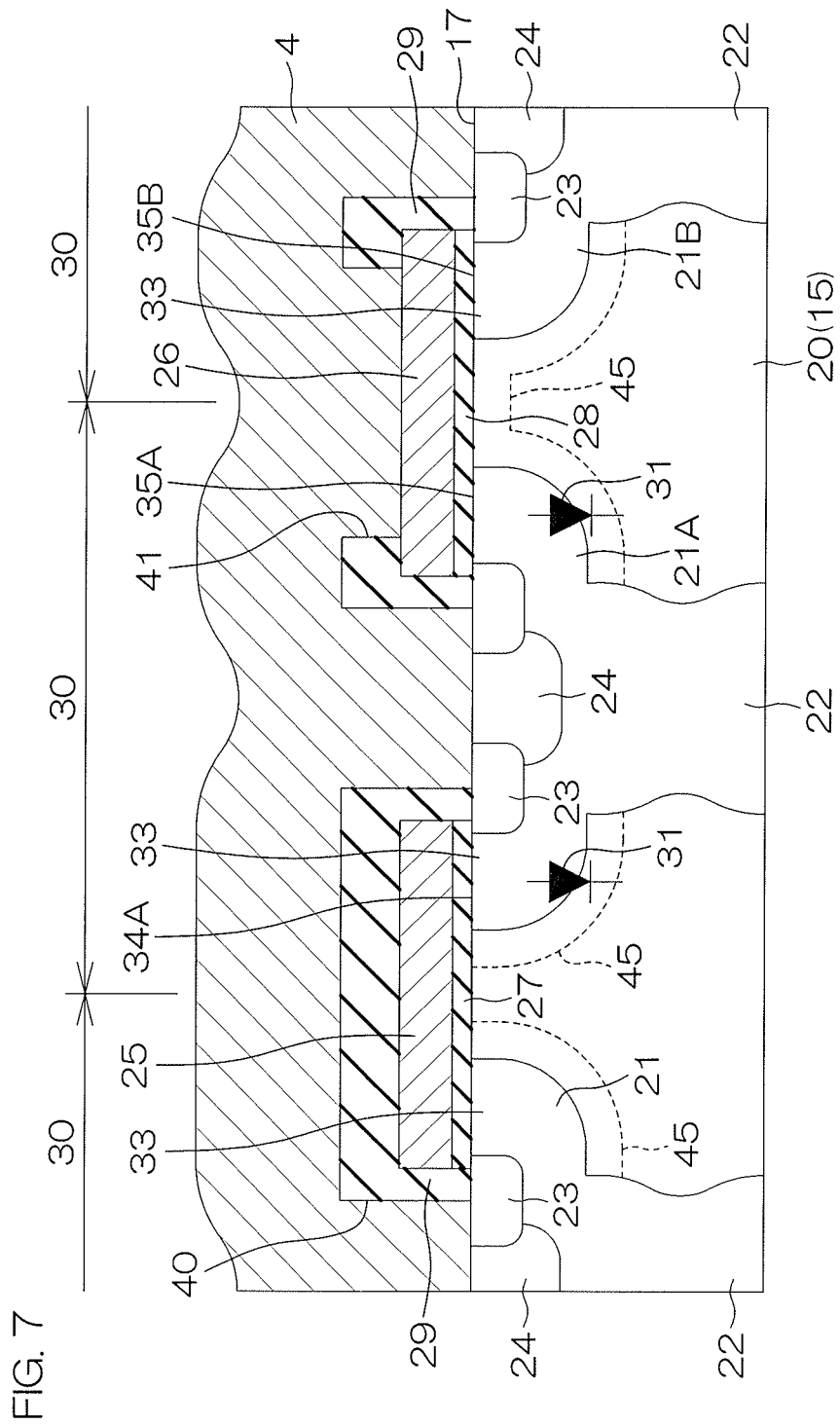
FIG. 7 is a view showing the state (simulation) of depletion in an uppermost surface of an epitaxial layer.
Figure 8:
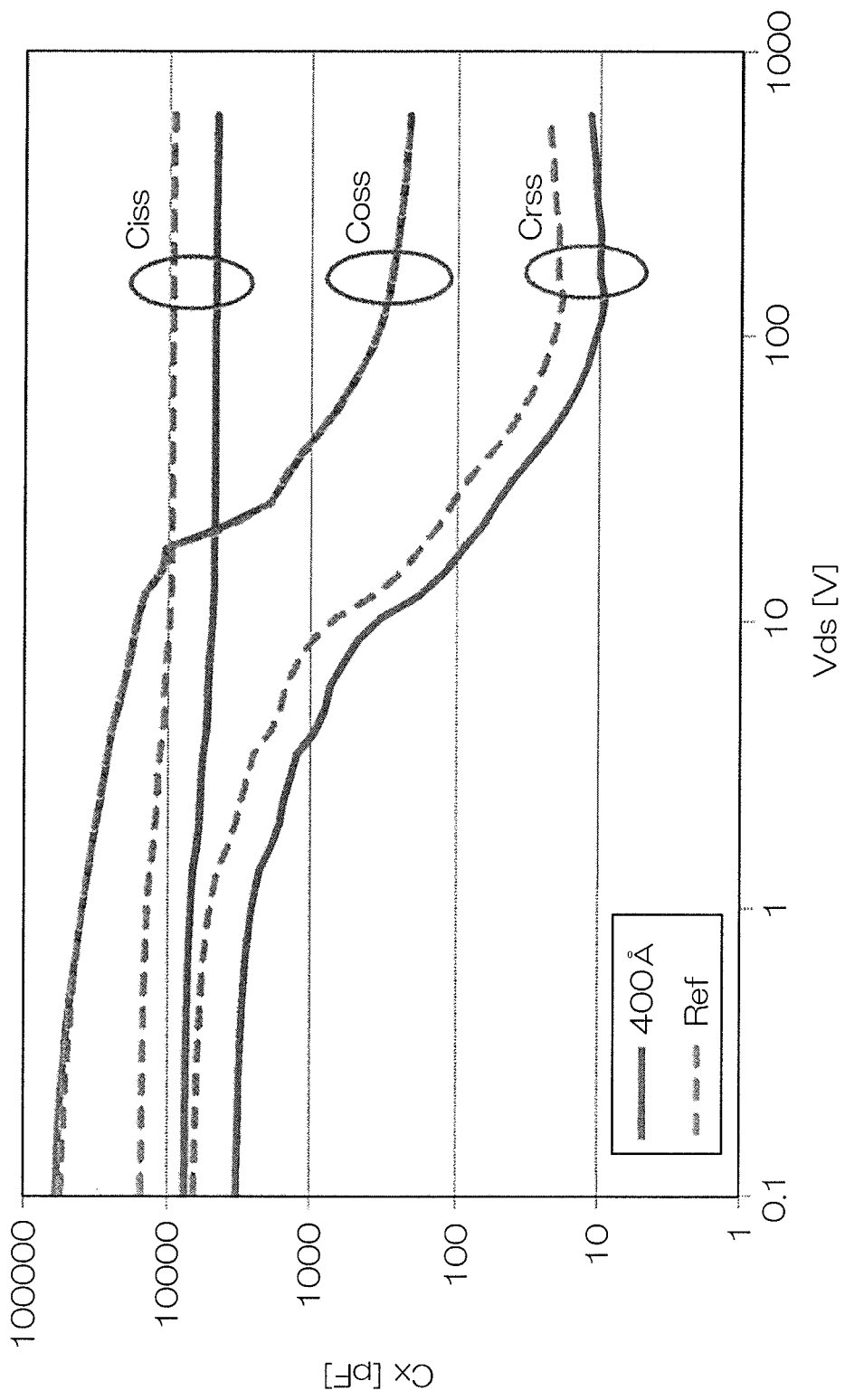
FIG. 8 is a graph showing simulation results concerning capacitance characteristics.

FIG. 5 shows simulation results (source currents) concerning recovery characteristics. FIG. 6 shows simulation results (drain-source voltages) concerning recovery characteristics. FIG. 7 shows the state (simulation) of depletion in an uppermost surface (first surface 17) of the epitaxial layer 15. FIG. 8 shows simulation results concerning capacitance characteristics.

Next, an improvement in recovery characteristics by the structure of the semiconductor device 1 described above is determined by simulation. Referring to FIGS. 5, 6, and 8, note that "400 Å" and "600 Å" are the thicknesses of gate insulating films, and "Ref (reference example)" is a structure not including the dummy gate electrode 26.

As shown in FIG. 5, according to the simulation results, it was possible to confirm that the reverse current (Irr) can be reduced as compared with the reference example (Ref). In addition, as shown in FIG. 6, the jump of the drain-source voltage (Vds) was suppressed and the peaks of the drain-source voltage (Vds) smoothly continued. It was thereby found that the occurrence of noise (recovery noise) can be suppressed. Therefore, the semiconductor device 1 according to this preferred embodiment can make the reverse recovery characteristics of the parasitic diode 31 approach soft recovery characteristics as compared with the reference example (Ref).

Further, FIG. 7 shows the result obtained by checking a hole density distribution by simulation when the uppermost surface (first surface 17) of the epitaxial layer 15 starts becoming depleted. Referring to FIG. 7, a depletion layer 45 is not formed in the first surface 17 of the n⁻ type drift layer 20 which faces the gate electrode 25, that is, depletion is not started, but the depletion layer 45 is formed in the first surface 17 of the n⁻ type drift layer 20 which faces the dummy gate electrode 26. That is, it was found that it was possible to advance the timing at which the depletion layer 45 extends in the first surface 17 of the n⁻ type drift layer 20 which faces the dummy gate electrode 26.

The structure of the semiconductor device 1 according to this preferred embodiment was compared with the reference example (Ref) in terms of parasitic capacitance when the thickness of the first gate insulating film 27 was set to 400 Å. As a result, as shown in FIG. 8, all of the Ciss (input capacitance), Coss (output capacitance), and Crss (feedback capacitance) were decreased as compared with the reference example (Ref). This may be because the area of a portion of the MISFET 2 which functions as a gate decreased.

Accordingly, by adjusting the combination ratio between the gate electrode 25 and the dummy gate electrode 26, it is possible to control both recovery characteristics and parasitic capacitances. For example, when the semiconductor device 1 is an on-vehicle device and it is desired to set lifetime control relatively weak, the ratio of the dummy gate electrode 26 may be set to be relatively small.

Although the preferred embodiment of the present invention has been described above, the present invention can also be implemented in other modes.

Figure 9:
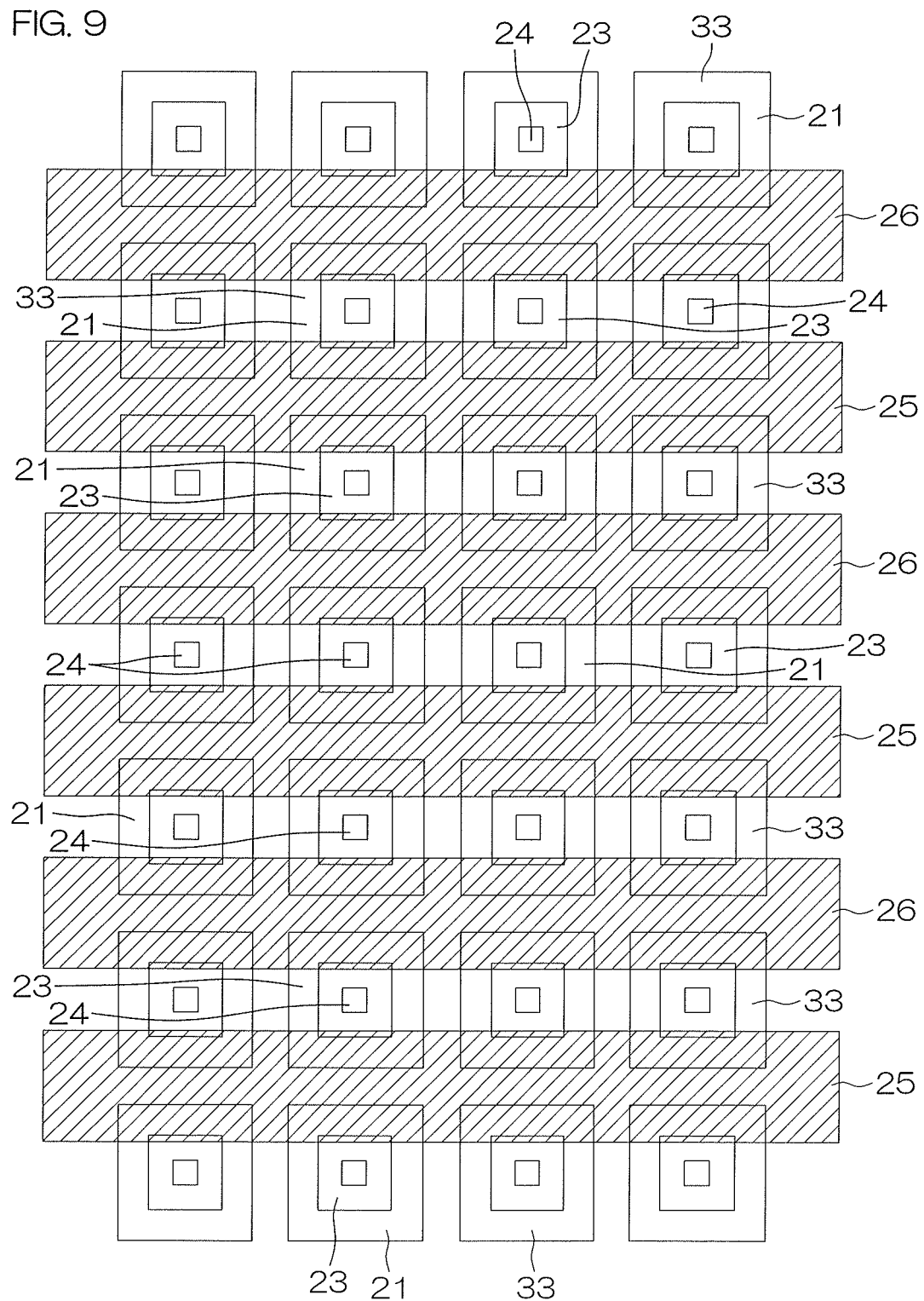
FIG. 9 is a view showing a modification of the semiconductor device.

For example, as shown in FIG. 9, a gate electrode 25 and a dummy gate electrode 26 each may be formed in a line shape extending along the row direction of a p type channel region 21. In this case, the gate electrode 25 and the dummy gate electrode 26 may be alternately formed in parallel with each other so as to form a striped pattern as a whole.

Figure 10:
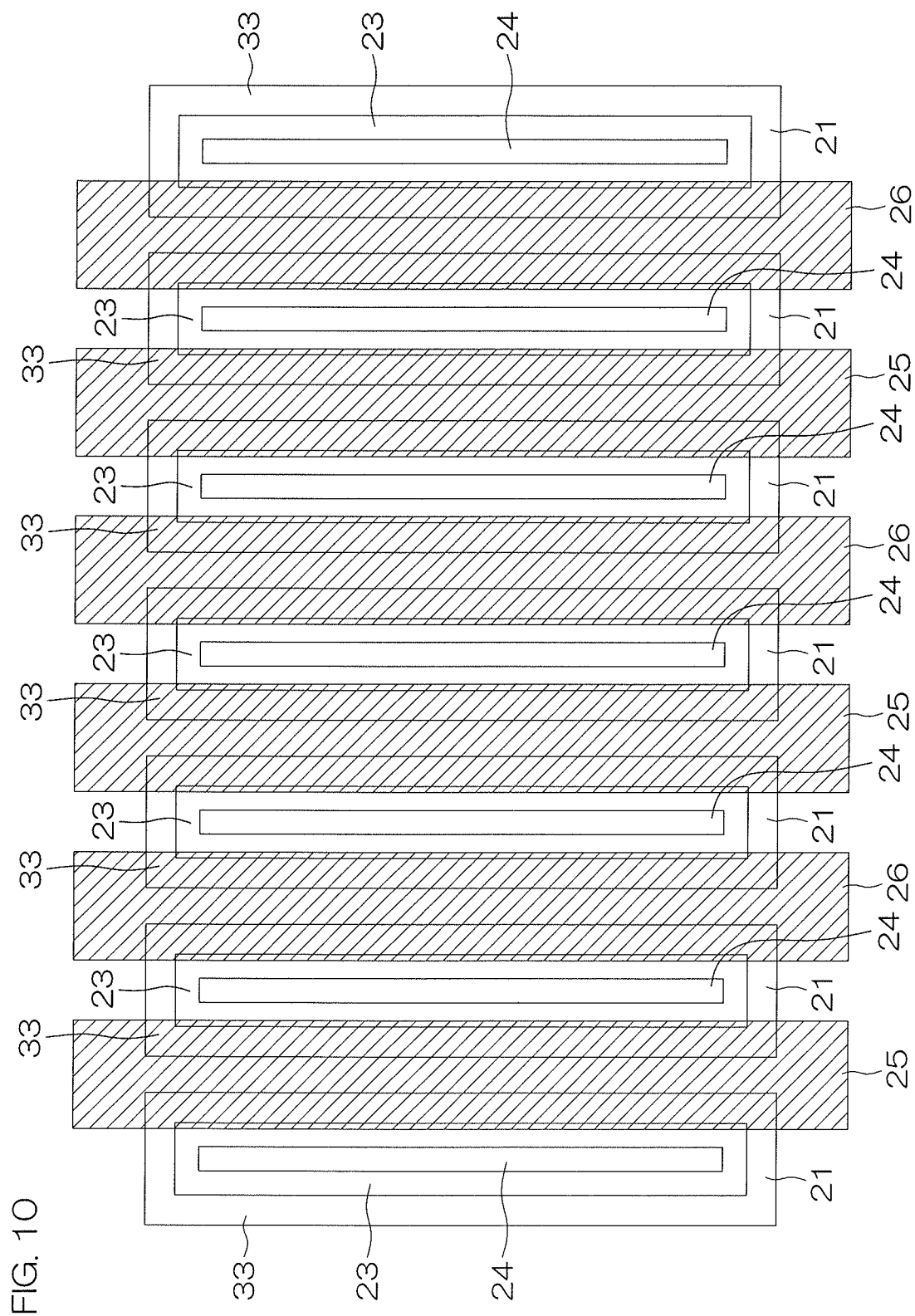
FIG. 10 is a view showing a modification of the semiconductor device.

As shown in FIG. 10, the p type channel regions 21 may be formed in a striped pattern. In this case, the gate electrode 25 and the dummy gate electrode 26 each may be formed in a line shape extending along the p type channel region 21. The line-shaped gate electrodes 25 and the line-shaped dummy gate electrodes 26 are alternately formed in parallel with each other so as to form a striped pattern as a whole.

Figure 11:
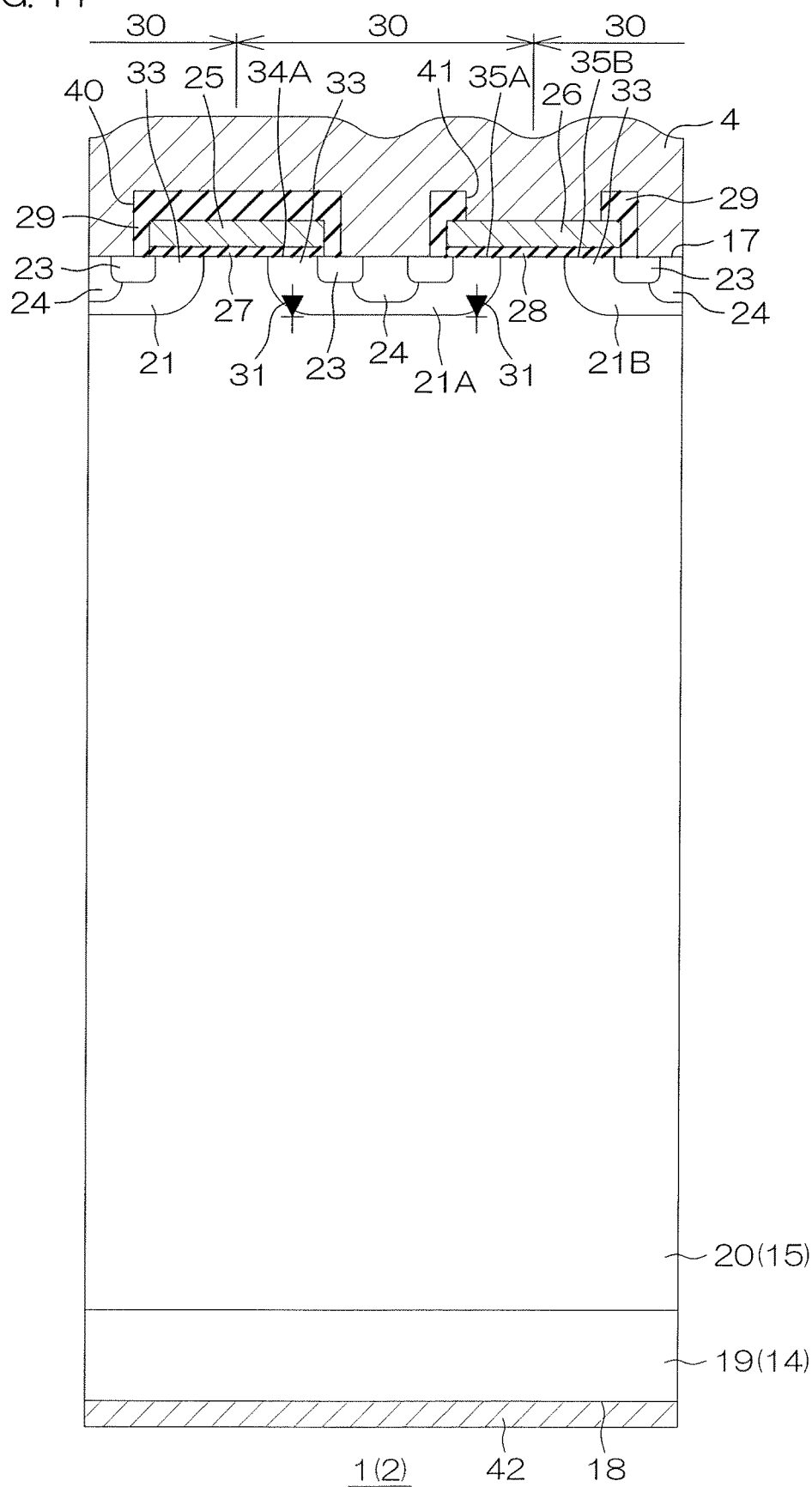
FIG. 11 is a schematic sectional view of a semiconductor device according to another preferred embodiment of the present invention.

In the above-described preferred embodiment, the MISFET 2 has a super junction structure. However, for example, as shown in FIG. 11, by omitting the p type pillar layers 22, the MISFET 2 may be a MISFET not including a super junction structure.

Figure 12:
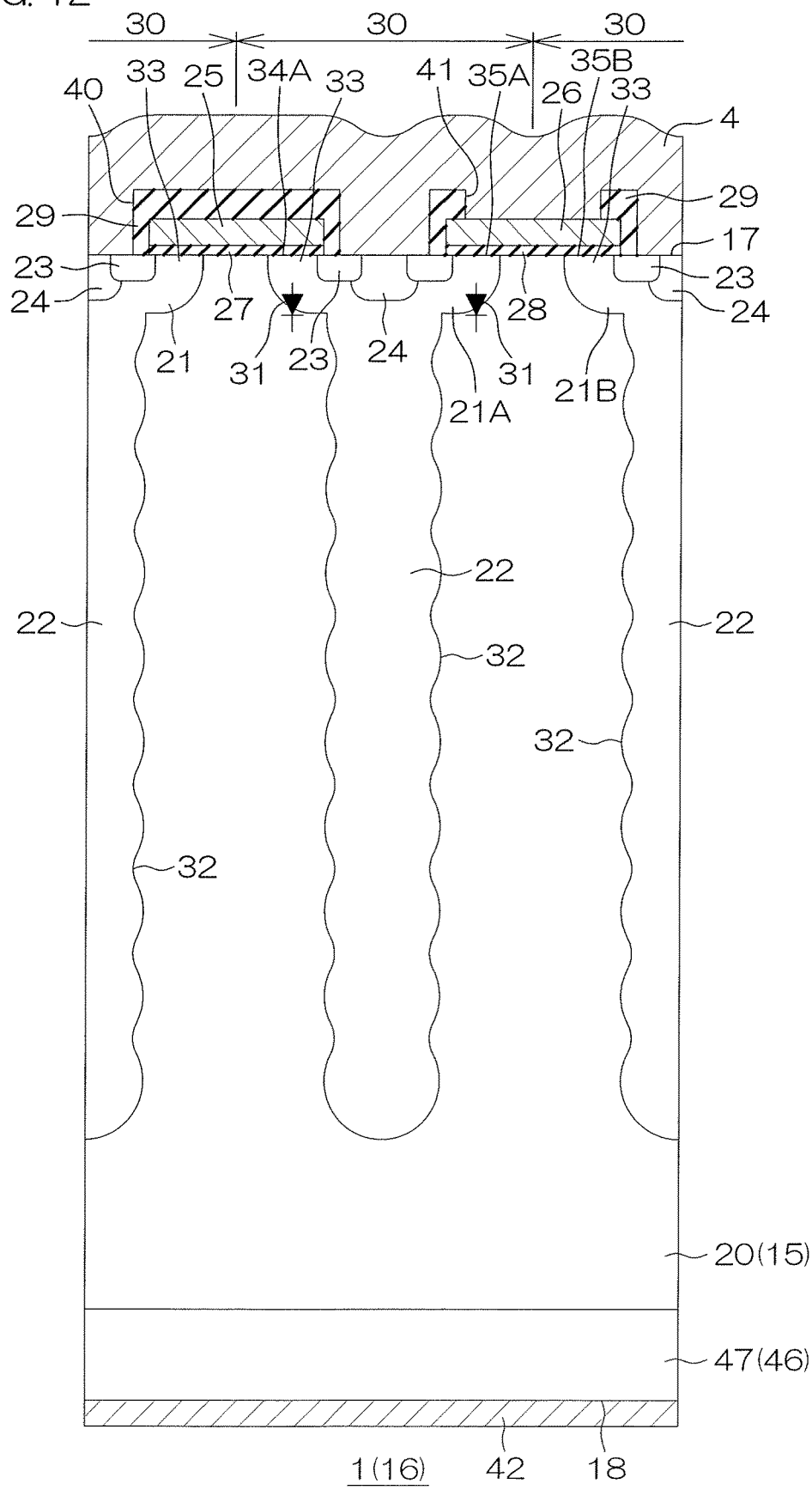
FIG. 12 is a schematic sectional view of a semiconductor device according to still another preferred embodiment of the present invention.

The above-described preferred embodiment has exemplified the MISFET 2 as an example of the element structure of the semiconductor device 1. However, for example, as shown in FIG. 12, the semiconductor device 1 may have an IGBT (insulated gate bipolar transistor) 16 by replacing the n⁺ type semiconductor substrate 14 with a p⁺ type semiconductor substrate 46 (p⁺ type collector layer 47). In this case, the drain electrode 42 and the source electrode film 4 may be respectively called a collector electrode and an emitter electrode film. In addition, the n⁺ type source region 23 and the p type channel region 21 may be respectively called an n⁺ type emitter region and a p type base region.

In addition, unit cells 30 of the MISFET 2 and the IGBT 16 each may have a planar gate structure as in the preferred embodiment described above or may instead have a trench gate structure.

In the above-described preferred embodiment, each electrode that faces the n⁻ type drift layer 20 through the insulating film and is connected to the source electrode film 4 is called the "dummy gate electrode 26." However, this electrode may be called by another name. That is, in the above-described preferred embodiment, such an electrode was called the "dummy gate electrode" merely because the electrode is formed in the same step (FIG. 4F) as that for the gate electrode 25 and does not function as a gate of the MISFET 2 regardless of facing the p type channel region 21. Accordingly, the "second gate insulating film 28" may also be called by another name.

Also, an arrangement in which the conductivity types of the respective semiconductor portions of the semiconductor device 1 are inverted may be adopted. For example, in the semiconductor device 1, a p type portion may be of an n type and an n type portion may be of a p type.

Besides the above, various design modifications may be made within the scope of the matters described in the claims.

What is claimed is:
1. A semiconductor device comprising:
a semiconductor layer having a first surface and a second surface;
a first region of a first conductivity type formed on the first surface of the semiconductor layer, the first region being exposed from the first surface;
a second region of a second conductivity type formed on the first surface of the semiconductor layer such that the second region is in contact with the first region, the second region being exposed from the first surface;
a third region of the first conductivity type that is in contact with the second region and exposed from the first surface of the semiconductor layer at a location adjacent to the second region;
a gate electrode formed on the first surface through a gate insulating film, the gate electrode facing the second region;
a first electrode that is physically separated from the gate electrode and is formed on the first surface through an insulating film, the first electrode facing the second region and the third region;
a second insulating film that is formed on the semiconductor layer, covers the gate electrode and the first electrode, and has a first opening that exposes the first region and the second region and a second opening that exposes the first electrode;
a second electrode formed on the second insulating film, the second electrode being connected to the first region and the second region in the first opening, and being connected to the first electrode in the second opening; and
a third electrode electrically connected to the third region, wherein a plurality of the second regions are formed on the first surface of the semiconductor layer such that each of the plurality of the second regions is in contact with the first region, a plurality of the first regions are formed on the first surface of the semiconductor layer, each of the plurality of the first regions being exposed from the first surface, the gate electrode and the first electrode face a same second region and a same first region.

2. The semiconductor device according to claim 1, wherein the insulating film has the same thickness as the gate insulating film.

3. The semiconductor device according to claim 2, wherein the gate insulating film and the insulating film each has a thickness of 300 Å to 700 Å.

4. The semiconductor device according to claim 1, further comprising a pillar portion of the second conductivity type that is formed on the second surface side of the semiconductor layer with respect to the second region and extends in a thickness direction of the semiconductor layer.

5. The semiconductor device according to claim 4, wherein the pillar portion is formed continuously with the second region.

6. The semiconductor device according to claim 1, wherein the second region includes a first portion facing the gate electrode and a second portion facing the first electrode.

7. The semiconductor device according to claim 6, wherein the plurality of the second regions are arrayed on the semiconductor layer in a matrix pattern, the third region is exposed from the first surface of the semiconductor layer as a lattice-shaped region between the second regions in the matrix pattern, the first electrode straddles the adjacent second regions and covers the third region between the adjacent second regions, and the gate electrode surrounds the first electrode and includes a lattice-shaped portion covering the third region.

8. The semiconductor device according to claim 6, wherein a plurality of the second regions are arrayed on the semiconductor layer in a matrix pattern, the third region is exposed from the first surface of the semiconductor layer as a lattice-shaped region between the second regions in the matrix pattern, the gate electrode and the first electrode each is formed in a line shape extending along a row direction or a column direction of the second regions, and the gate electrode and the first electrode, each having the line shape, extend parallel to each other and form a striped pattern as a whole.

9. The semiconductor device according to claim 6, wherein a plurality of the second regions are arrayed on the semiconductor layer in a striped pattern, the gate electrode and the first electrode each is formed in a line shape extending along the second region, and the gate electrode and the first electrode, each having the line shape, extend parallel to each other and form a striped pattern a striped pattern as a whole.

10. The semiconductor device according to claim 1, wherein the gate electrode and the first electrode each has a planar gate structure formed along the first surface of the semiconductor layer.

11. The semiconductor device according to claim 1, wherein the semiconductor device includes a MISFET having the first region as a source region and the second region as a channel region.

12. The semiconductor device according to claim 1, further comprising an IGBT including the first region as an emitter region, the second region as a base region, and a collector region of the second conductivity type in contact with the third region.

13. The semiconductor device according to claim 1, wherein the gate electrode and the first electrode have a same shape as each other in a sectional view.

14. The semiconductor device according to claim 1, wherein the second insulating film integrally covers a side surface of the first electrode and a peripheral portion of an upper surface of the first electrode.

* * * * *